US012435412B2

(12) United States Patent
Weimer et al.

(10) Patent No.: US 12,435,412 B2
(45) Date of Patent: Oct. 7, 2025

(54) HIGH DENSITY, MODULUS, AND HARDNESS AMORPHOUS CARBON FILMS AT LOW PRESSURE

(71) Applicant: Lam Research Corporation, Fremont, CA (US)

(72) Inventors: Matthew Scott Weimer, Portland, OR (US); Ragesh Puthenkovilakam, Portland, OR (US); Gordon Alex Macdonald, Sherwood, OR (US); Shaoqing Zhang, Fremont, CA (US); Shih-Ked Lee, Fremont, CA (US); Jun Xue, Fremont, CA (US); Samantha S. H. Tan, Newark, CA (US); Xizhu Zhao, San Jose, CA (US); Mary Anne Manumpil, Fremont, CA (US); Eric A. Hudson, Berkeley, CA (US); Chin-Jui Hsu, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 129 days.

(21) Appl. No.: 17/753,208

(22) PCT Filed: Aug. 28, 2020

(86) PCT No.: PCT/US2020/048551
§ 371 (c)(1),
(2) Date: Feb. 23, 2022

(87) PCT Pub. No.: WO2021/041916
PCT Pub. Date: Mar. 4, 2021

(65) Prior Publication Data
US 2022/0282366 A1 Sep. 8, 2022

Related U.S. Application Data
(60) Provisional application No. 62/894,197, filed on Aug. 30, 2019.

(51) Int. Cl.
*C23C 16/26* (2006.01)
*C23C 16/04* (2006.01)
*C23C 16/40* (2006.01)

(52) U.S. Cl.
CPC ............ *C23C 16/26* (2013.01); *C23C 16/042* (2013.01); *C23C 16/402* (2013.01)

(58) Field of Classification Search
CPC ...... C23C 16/26; C23C 16/042; C23C 16/402
See application file for complete search history.

(56) References Cited

U.S. PATENT DOCUMENTS 2,146,448 A 2/1939 Scott et al.
2,405,693 A 8/1946 Hamill et al.
(Continued)

FOREIGN PATENT DOCUMENTS

CN 1877450 A 12/2006
CN 1914715 A 2/2007
(Continued)

OTHER PUBLICATIONS

Lee et al. Bonding structure and etching characteristics of amorphous carbon for a hardmask deposited by DC sputtering, Carbon 154 (2019) pp. 277-284. (Year: 2019).*
(Continued)

*Primary Examiner* — Kelly M Gambetta
(74) *Attorney, Agent, or Firm* — Weaver Austin Villeneuve & Sampson LLP

(57) ABSTRACT

Provided herein are methods and related apparatus for depositing an ashable hard mask (AHM) on a substrate in a low pressure chamber using a dual frequency radio frequency component. Low pressure plasma enhanced chemical vapor deposition may be used to increase the etch selectivity of the AHM, permitting the use of a thinner AHM for semiconductor processing operations.

27 Claims, 12 Drawing Sheets

(56) References Cited

U.S. PATENT DOCUMENTS

| | | | |
|---|---|---|---|
| 3,816,976 | A | 6/1974 | Stork et al. |
| 4,209,357 | A | 6/1980 | Gorin et al. |
| 4,274,841 | A | 6/1981 | Andresen et al. |
| 4,668,261 | A | 5/1987 | Chatzipetros et al. |
| 4,673,589 | A | 6/1987 | Standley |
| 4,863,493 | A | 9/1989 | Kotani et al. |
| 4,863,760 | A | 9/1989 | Schantz et al. |
| 4,975,144 | A | 12/1990 | Yamazaki et al. |
| 5,022,959 | A | 6/1991 | Itoh et al. |
| 5,222,549 | A | 6/1993 | Ishii et al. |
| 5,231,057 | A | 7/1993 | Doki et al. |
| 5,261,250 | A | 11/1993 | Missimer |
| 5,378,316 | A | 1/1995 | Franke et al. |
| 5,419,804 | A | 5/1995 | Ojha et al. |
| 5,470,661 | A | 11/1995 | Bailey et al. |
| 5,562,952 | A | 10/1996 | Nakahigashi et al. |
| 5,670,066 | A | 9/1997 | Barnes et al. |
| 5,792,269 | A | 8/1998 | Deacon et al. |
| 5,900,288 | A | 5/1999 | Kuhman et al. |
| 5,948,704 | A | 9/1999 | Benjamin et al. |
| 5,968,379 | A | 10/1999 | Zhao et al. |
| 5,985,103 | A | 11/1999 | Givens et al. |
| 6,006,797 | A | 12/1999 | Bulow et al. |
| 6,030,591 | A | 2/2000 | Tom et al. |
| 6,035,803 | A | 3/2000 | Robles et al. |
| 6,041,734 | A | 3/2000 | Raoux et al. |
| 6,066,209 | A | 5/2000 | Sajoto et al. |
| 6,114,259 | A | 9/2000 | Sukharev et al. |
| 6,150,719 | A | 11/2000 | Saia et al. |
| 6,241,793 | B1 | 6/2001 | Lee et al. |
| 6,286,321 | B1 | 9/2001 | Glater |
| 6,319,299 | B1 | 11/2001 | Shih et al. |
| 6,331,480 | B1 | 12/2001 | Tsai et al. |
| 6,367,413 | B1 | 4/2002 | Sill et al. |
| 6,387,819 | B1 | 5/2002 | Yu |
| 6,422,918 | B1 | 7/2002 | Avanzino et al. |
| 6,458,516 | B1 | 10/2002 | Ye et al. |
| 6,465,051 | B1 | 10/2002 | Sahin et al. |
| 6,478,924 | B1 | 11/2002 | Shamouilian et al. |
| 6,541,397 | B1 | 4/2003 | Bencher |
| 6,573,030 | B1 | 6/2003 | Fairbairn et al. |
| 6,613,434 | B1 | 9/2003 | Drevillon et al. |
| 6,617,553 | B2 | 9/2003 | Ho et al. |
| 6,635,185 | B2 | 10/2003 | Demmin et al. |
| 6,777,349 | B2 | 8/2004 | Fu et al. |
| 6,787,452 | B2 | 9/2004 | Sudijono et al. |
| 6,787,819 | B2 | 9/2004 | Rhodes et al. |
| 6,884,733 | B1 | 4/2005 | Dakshina-Murthy et al. |
| 6,967,072 | B2 | 11/2005 | Latchford et al. |
| 6,984,591 | B1 | 1/2006 | Buchanan et al. |
| 7,063,742 | B1 | 6/2006 | Ando et al. |
| 7,064,078 | B2 | 6/2006 | Liu et al. |
| 7,202,176 | B1 | 4/2007 | Goto et al. |
| 7,205,228 | B2 | 4/2007 | Padhi et al. |
| 7,220,982 | B2 | 5/2007 | Campbell |
| 7,223,526 | B2 | 5/2007 | Fairbairn et al. |
| 7,235,478 | B2 | 6/2007 | Geng et al. |
| 7,271,106 | B2 | 9/2007 | Abatchev et al. |
| 7,288,484 | B1 | 10/2007 | Goto et al. |
| 7,314,506 | B2 | 1/2008 | Vininski et al. |
| 7,323,401 | B2 | 1/2008 | Ramaswamy et al. |
| 7,381,644 | B1 | 6/2008 | Subramonium et al. |
| 7,399,712 | B1 | 7/2008 | Graff |
| 7,407,893 | B2 | 8/2008 | Seamons et al. |
| 7,495,984 | B2 | 2/2009 | Kim et al. |
| 7,576,009 | B2 | 8/2009 | Lee et al. |
| 7,637,269 | B1 | 12/2009 | Zin et al. |
| 7,732,728 | B2 | 6/2010 | Dhindsa et al. |
| 7,740,736 | B2 | 6/2010 | Fischer et al. |
| 7,803,715 | B1 | 9/2010 | Haimson et al. |
| 7,820,556 | B2 | 10/2010 | Hsu et al. |
| 7,915,166 | B1 | 3/2011 | Yu et al. |
| 7,955,990 | B2 | 6/2011 | Henri et al. |
| 7,981,777 | B1 * | 7/2011 | Subramonium ...... C23C 16/509 438/485 |
| 7,981,810 | B1 | 7/2011 | Subramonium et al. |
| 8,110,493 | B1 | 2/2012 | Subramonium et al. |
| 8,114,782 | B2 | 2/2012 | Graff |
| 8,129,281 | B1 | 3/2012 | Cheung et al. |
| 8,227,352 | B2 | 7/2012 | Yu et al. |
| 8,309,473 | B2 | 11/2012 | Hsu et al. |
| 8,361,906 | B2 | 1/2013 | Lee et al. |
| 8,435,608 | B1 | 5/2013 | Subramonium et al. |
| 8,563,414 | B1 | 10/2013 | Fox et al. |
| 8,569,179 | B2 | 10/2013 | Graff |
| 8,664,124 | B2 | 3/2014 | Graff |
| 8,669,181 | B1 | 3/2014 | Yu et al. |
| 8,962,101 | B2 | 2/2015 | Subramonium et al. |
| 9,240,320 | B1 | 1/2016 | Subramonium et al. |
| 9,304,396 | B2 | 4/2016 | Shamma et al. |
| 9,320,387 | B2 | 4/2016 | Reddy et al. |
| 9,543,148 | B1 | 1/2017 | Hudson et al. |
| 9,589,799 | B2 | 3/2017 | Reddy et al. |
| 9,618,846 | B2 | 4/2017 | Shamma et al. |
| 11,837,441 | B2 | 12/2023 | Weimer et al. |
| 2001/0021491 | A1 | 9/2001 | Chen et al. |
| 2002/0182848 | A1 | 12/2002 | Joseph et al. |
| 2002/0185151 | A1 | 12/2002 | Qingyuan et al. |
| 2003/0044532 | A1 | 3/2003 | Lee et al. |
| 2003/0106647 | A1 | 6/2003 | Koshiishi et al. |
| 2003/0119307 | A1 | 6/2003 | Bekiaris et al. |
| 2003/0124859 | A1 | 7/2003 | Cheung et al. |
| 2004/0000534 | A1 | 1/2004 | Lipinski |
| 2004/0016972 | A1 | 1/2004 | Singh et al. |
| 2004/0018750 | A1 | 1/2004 | Sophie et al. |
| 2004/0023502 | A1 | 2/2004 | Tzou et al. |
| 2004/0058517 | A1 | 3/2004 | Nallan et al. |
| 2004/0140506 | A1 | 7/2004 | Singh et al. |
| 2004/0180551 | A1 | 9/2004 | Biles et al. |
| 2004/0224504 | A1 | 11/2004 | Gadgil |
| 2004/0266195 | A1 | 12/2004 | Dokumaci et al. |
| 2005/0042889 | A1 | 2/2005 | Lee et al. |
| 2005/0054202 | A1 | 3/2005 | Pan et al. |
| 2005/0098119 | A1 | 5/2005 | Burger et al. |
| 2005/0112506 | A1 | 5/2005 | Czech et al. |
| 2005/0129935 | A1 | 6/2005 | Kunitake et al. |
| 2005/0130404 | A1 | 6/2005 | Moghadam et al. |
| 2005/0167394 | A1 | 8/2005 | Liu et al. |
| 2005/0202683 | A1 | 9/2005 | Wang et al. |
| 2005/0260411 | A1 | 11/2005 | Ravi |
| 2005/0287771 | A1 | 12/2005 | Seamons et al. |
| 2006/0019486 | A1 | 1/2006 | Yu et al. |
| 2006/0024945 | A1 | 2/2006 | Kim et al. |
| 2006/0046483 | A1 | 3/2006 | Abatchev et al. |
| 2006/0091559 | A1 | 5/2006 | Nguyen et al. |
| 2006/0105577 | A1 | 5/2006 | Donohoe et al. |
| 2006/0154086 | A1 | 7/2006 | Fuller et al. |
| 2006/0154477 | A1 | 7/2006 | Geng et al. |
| 2006/0197881 | A1 | 9/2006 | Kang et al. |
| 2006/0205223 | A1 | 9/2006 | Smayling |
| 2006/0231524 | A1 | 10/2006 | Liu et al. |
| 2006/0246373 | A1 | 11/2006 | Wang |
| 2007/0032054 | A1 | 2/2007 | Ramaswamy et al. |
| 2007/0048674 | A1 | 3/2007 | Wells |
| 2007/0054500 | A1 | 3/2007 | Bencher |
| 2007/0059913 | A1 | 3/2007 | King et al. |
| 2007/0072112 | A1 | 3/2007 | Prokopowicz et al. |
| 2007/0077780 | A1 | 4/2007 | Wang et al. |
| 2007/0087520 | A1 | 4/2007 | Mitsuiki et al. |
| 2007/0105303 | A1 | 5/2007 | Busch et al. |
| 2007/0125762 | A1 | 6/2007 | Cui et al. |
| 2007/0128538 | A1 | 6/2007 | Fairbairn et al. |
| 2007/0134917 | A1 | 6/2007 | Li et al. |
| 2007/0140029 | A1 | 6/2007 | Kim et al. |
| 2007/0166546 | A1 | 7/2007 | Ichikawa et al. |
| 2007/0166979 | A1 | 7/2007 | Wang et al. |
| 2007/0202640 | A1 | 8/2007 | Al-Bayati et al. |
| 2007/0245960 | A1 | 10/2007 | Paterson et al. |
| 2007/0247073 | A1 | 10/2007 | Paterson et al. |
| 2007/0249172 | A1 | 10/2007 | Huang et al. |
| 2007/0275560 | A1 * | 11/2007 | Nishimura ........ H01L 21/31138 156/345.48 |
| 2008/0073636 | A1 | 3/2008 | Kim |
| 2008/0083916 | A1 | 4/2008 | Kim |

(56) References Cited

U.S. PATENT DOCUMENTS

| | | | |
|---|---|---|---|
| 2008/0085606 | A1 | 4/2008 | Fischer et al. |
| 2008/0128907 | A1 | 6/2008 | Yang et al. |
| 2008/0200003 | A1 | 8/2008 | Hong et al. |
| 2008/0211118 | A1 | 9/2008 | Wyse et al. |
| 2008/0242912 | A1 | 10/2008 | Letessier et al. |
| 2008/0254639 | A1 | 10/2008 | Graff |
| 2008/0254641 | A1 | 10/2008 | Kobayashi et al. |
| 2008/0264803 | A1 | 10/2008 | Agrawal |
| 2009/0176174 | A1 | 7/2009 | Chen et al. |
| 2009/0182180 | A1 | 7/2009 | Huang et al. |
| 2009/0286402 | A1 | 11/2009 | Xia et al. |
| 2009/0294062 | A1 | 12/2009 | Shannon et al. |
| 2009/0305516 | A1 | 12/2009 | Hsu et al. |
| 2010/0032838 | A1 | 2/2010 | Kikuchi et al. |
| 2010/0151691 | A1 | 6/2010 | Henri et al. |
| 2010/0197558 | A1 | 8/2010 | Miralles et al. |
| 2010/0297853 | A1 | 11/2010 | Hsu et al. |
| 2011/0236594 | A1 | 9/2011 | Haverkamp et al. |
| 2011/0236600 | A1 | 9/2011 | Fox et al. |
| 2011/0244142 | A1 | 10/2011 | Cheng et al. |
| 2011/0287633 | A1 | 11/2011 | Lee et al. |
| 2012/0121764 | A1 | 5/2012 | Lai et al. |
| 2012/0149207 | A1 | 6/2012 | Graff |
| 2012/0164836 | A1 | 6/2012 | Chumakov |
| 2012/0196446 | A1 | 8/2012 | Graff |
| 2012/0258261 | A1 | 10/2012 | Reddy et al. |
| 2013/0109188 | A1 | 5/2013 | Kim et al. |
| 2013/0216956 | A1 | 8/2013 | Kishioka et al. |
| 2013/0333616 | A1 | 12/2013 | Klindworth et al. |
| 2014/0057442 | A1 | 2/2014 | Lee et al. |
| 2014/0057454 | A1 | 2/2014 | Subramonium et al. |
| 2014/0113457 | A1 | 4/2014 | Sims et al. |
| 2014/0199628 | A1 | 7/2014 | Edelstein et al. |
| 2014/0239462 | A1 | 8/2014 | Shamma et al. |
| 2014/0273469 | A1 | 9/2014 | Wahl et al. |
| 2014/0273473 | A1 | 9/2014 | Schmid et al. |
| 2015/0093908 | A1* | 4/2015 | Reddy ............... H01L 21/02115 438/758 |
| 2015/0093915 | A1 | 4/2015 | Reddy et al. |
| 2015/0179466 | A1 | 6/2015 | Takayama et al. |
| 2015/0287612 | A1 | 10/2015 | Luere et al. |
| 2016/0179005 | A1 | 6/2016 | Shamma et al. |
| 2016/0225632 | A1 | 8/2016 | Shaikh et al. |
| 2016/0254171 | A1 | 9/2016 | Shamma et al. |
| 2016/0281230 | A1* | 9/2016 | Varadarajan ...... H01J 37/32486 |
| 2016/0314960 | A1 | 10/2016 | Cheng et al. |
| 2016/0314986 | A1 | 10/2016 | Tominaga et al. |
| 2016/0343580 | A1 | 11/2016 | Hudson |
| 2017/0178920 | A1 | 6/2017 | Dole et al. |
| 2018/0068852 | A1 | 3/2018 | Cottle et al. |
| 2018/0286707 | A1 | 10/2018 | Hudson et al. |
| 2018/0358220 | A1 | 12/2018 | Yu et al. |
| 2018/0358222 | A1 | 12/2018 | Venkatasubramanian et al. |
| 2021/0151301 | A1 | 5/2021 | Niizeki et al. |
| 2021/0159084 | A1 | 5/2021 | Tomura et al. |
| 2022/0181147 | A1 | 6/2022 | Xue et al. |
| 2022/0216037 | A1 | 7/2022 | Weimer et al. |
| 2023/0167545 | A1 | 6/2023 | Reddy et al. |
| 2023/0357921 | A1 | 11/2023 | Weimer et al. |
| 2023/0360922 | A1 | 11/2023 | Weimer et al. |
| 2024/0030028 | A1 | 1/2024 | Antony et al. |
| 2024/0136153 | A1 | 4/2024 | Weimer et al. |
| 2024/0234091 | A9 | 7/2024 | Weimer et al. |

FOREIGN PATENT DOCUMENTS

| | | | |
|---|---|---|---|
| CN | 1930670 | A | 3/2007 |
| CN | 1953146 | A | 4/2007 |
| CN | 102001616 | A | 4/2011 |
| CN | 102790127 | A | 11/2012 |
| CN | 103578937 | A | 2/2014 |
| CN | 104513973 | A | 4/2015 |
| CN | 104517815 | A | 4/2015 |
| CN | 106067440 | A | 11/2016 |
| CN | 109023311 | A | 12/2018 |
| EP | 1720072 | A1 | 11/2006 |
| EP | 4022670 | A1 | 7/2022 |
| FR | 2853313 | A1 | 10/2004 |
| JP | S62019539 | A | 1/1987 |
| JP | H08152262 | A | 6/1996 |
| JP | 2000026194 | A | 1/2000 |
| JP | 2001148382 | A | 5/2001 |
| JP | 2002060944 | A | 2/2002 |
| JP | 2002212740 | A | 7/2002 |
| JP | 2004238649 | A | 8/2004 |
| JP | 2005187318 | A | 7/2005 |
| JP | 2005240061 | A | 9/2005 |
| JP | 2005354109 | A | 12/2005 |
| JP | 2007531987 | A | 11/2007 |
| JP | 2008141009 | A | 6/2008 |
| JP | 2008291344 | A | 12/2008 |
| JP | 2009226277 | A | 10/2009 |
| JP | 2011085670 | A | 4/2011 |
| JP | 2012233259 | A | 11/2012 |
| JP | 2013526061 | A | 6/2013 |
| JP | 2013526783 | A | 6/2013 |
| JP | 2018507933 | A | 3/2018 |
| JP | 2018511166 | A | 4/2018 |
| JP | 2019096888 | A | 6/2019 |
| JP | 2020102628 | A | 7/2020 |
| JP | 2020523785 | A | 8/2020 |
| KR | 20030051692 | A | 6/2003 |
| KR | 20040023557 | A | 3/2004 |
| KR | 20060010932 | A | 2/2006 |
| KR | 20060053855 | A | 5/2006 |
| KR | 20070015031 | A | 2/2007 |
| KR | 20070040596 | A | 4/2007 |
| KR | 100866735 | B1 | 11/2008 |
| KR | 100986503 | B1 | 10/2010 |
| KR | 20110065469 | A | 6/2011 |
| KR | 20130086525 | A | 8/2013 |
| KR | 20140068055 | A | 6/2014 |
| KR | 20150103642 | A | 9/2015 |
| KR | 20200140388 | A | 12/2020 |
| KR | 20220051009 | A | 4/2022 |
| SU | 382671 | A | 10/1973 |
| TW | 200723447 | A | 6/2007 |
| TW | 200937517 | A | 9/2009 |
| TW | 201133618 | A | 10/2011 |
| TW | 201204862 | A | 2/2012 |
| TW | 201528374 | A | 7/2015 |
| TW | 1554634 | B | 10/2016 |
| TW | 202006175 | A | 2/2020 |
| WO | WO-2005048367 | A1 | 5/2005 |
| WO | WO-2011146212 | A2 | 11/2011 |
| WO | WO-2012050065 | A1 | 4/2012 |
| WO | WO-2013182299 | A1 | 12/2013 |
| WO | WO-2018213318 | A1 | 11/2018 |
| WO | WO-2020041213 | A1 | 2/2020 |
| WO | WO-2020243342 | A1 | 12/2020 |
| WO | WO-2021041916 | A1 | 3/2021 |

OTHER PUBLICATIONS

Callegari et al. (1993) "Optical properties of hydrogenated amorphous-carbon film for attenuated phase-shift mask applications," J.Vac. Sci. Technol. B 11(6):2697-2699.

Chinese First Office Action, dated Aug. 1, 2016, issued in Application No. CN 201410513782.9.

Chinese First Office Action, dated Aug. 16, 2016, issued in Application No. CN 201310049856.3.

Chinese First Office Action dated Nov. 22, 2019 issued in Application No. CN 201810585572.9.

Chinese First Office Action, dated Oct. 9, 2016, issued in Application No. CN 201410513389.X.

Chinese Second Office Action, dated Feb. 24, 2017, issued in Application No. CN 201310049856.3.

Chinese Second Office Action dated Mar. 28, 2017 issued in Application No. CN 201410513782.9.

Chinese Second Office Action dated Oct. 28, 2020 issued in Application No. CN 201810585572.9.

(56) References Cited

OTHER PUBLICATIONS

Chinese Third Office Action dated Mar. 22, 2021 issued in Application No. CN 201810585572.9.
Chinese Third Office Action dated Sep. 19, 2017 issued in Application No. CN 201410513782.9.
Decision to Grant a Patent dated Mar. 10, 2020 issued in JP 2014-193209.
FABTECH news release: “New Product: Ashable hard mask process from Novellus targets high aspect ratio etch,” (Jun. 28, 2007), 2 pages.
Grill, A. (1999) “Diamond-like carbon: state of the art,” Diamond and Related Materials 8,pp. 428-434.
Grill, A. (1999) “Plasma-deposited diamondlike carbon and related materials,” IBM Journal of Research and Development, vol. 43, ½, http://research.ibm.com/journal/rd/431/grill.html., 14 pp.
Grill, et al. (1990) “Diamondlike carbon films by rf plasma-assisted chemical vapor deposition from acetylene,” IBM J. Res. Develop., 34(6):849-857.
Holmes et al. (1987) “Trimethylsilylacetylene”, Organic Syntheses, Coll. vol. 8, p. 606; vol. 65, p. 61.
Ikeda et al. (1992) “Top-PECVD”: A New Conformal Plasma Enhanced CVD Technology using TEOS, Ozone and Pulse-modulated RF Plasma, IEEE, pp. 11.2.1-11.2.4.
International Preliminary Report on Patentability dated Dec. 9, 2021, for International Application No. PCT/US2020/034971.
International Preliminary Report on Patentability dated Mar. 10, 2022, in Application No. PCT/US2020/048551.
International Search Report and Written Opinion dated Dec. 4, 2020 issued in PCT/US2020/048551.
International Search Report and Written Opinion dated Sep. 18, 2020 issued in PCT/US2020/034971.
Jacobsohn et al. (1998) “Hydrogenated Carbon-Nitrogen Films Obtained by PECVD Using Acetylyne and Nitrogen as Precursor Gases,” Mat. Res. Soc. Symp. Proc., 498: 283-288.
Japanese First Office Action dated Jul. 6, 2018 issued in Application No. JP 2014-193560.
Japanese First Office Action dated Jun. 27, 2018 issued in JP 2014-193209.
Japanese First Office Action dated Mar. 24, 2020 issued in Application No. JP 2019-005610.
Japanese Second Office Action dated Mar. 15, 2021 issued in Application No. JP 2019-005610.
Japanese Second Office Action dated May 27, 2019 issued in JP 2014-193209.
Korean First Office Action dated Apr. 19, 2021 issued in KR 10-2014-0130456.
Korean First Office Action dated Apr. 20, 2021 issued in Application No. KR 10-2014-0130444.
Korean First Office Action, dated Aug. 27, 2019, issued in Application No. KR 10-2013-0015077.
Korean First Office Action dated Jul. 29, 2021 issued in KR 10-2021-0054382.
Korean First Office Action dated Jun. 28, 2020 issued in KR 10-2014-0022022.
Korean Office Action, dated Jun. 1, 2010, issued in Application No. KR 2009/0048358.
Korean Office Action, dated Sep. 15, 2015, issued in Application No. KR 10-2009-0123999.
Korean Second Office Action dated Sep. 10, 2021 issued in KR 10-2014-0130456.
Korean Second Office Action dated Sep. 8, 2021 issued in Application No. KR 10-2014-0130444.
KR Office Action dated Dec. 14, 2021, in Application No. KR1020140130456 with English translation.
KR Office Action dated Jan. 24, 2022, in Application No. KR1020210054382 with English translation.
Kragler et al. (1995) “Scanning tunneling microscopy based lithography employing amorphous hydrogenated carbon as a high resolution resist mask,” Appl. Phys. Lett. 67(8):1163-1165.
Kreupl, Franz et al. (2008) “Carbon-Based Resistive Memory,” presented at IEDM, submitted Jun. 26, 2008; accepted Aug. 4, 2008, 4 pages.
Lemaire, P.J., Walker, K.L., Kranz, K.S., Huff, R.G. and DiMarcello, F.V., (1990) “Diffusion of Hydrogen Through Hermetic Carbon Films on Silica Fibers,” AT&T Bell Laboratories, 600 Mountain Avenue, Murray Hill, NJ 07974, Mat. Res. Soc. Symp. Proc. vol. 172, 12 pages, © 1990 Materials Research Society.
Matheson brochure: “PICO-TRAPTM AHM: Ultra-Purification System for PECVD of Amorphous Carbon Films,” (Apr. 2010), Matheson, 2pp.
Muhl et al. (1999) “A Review of the Preparation of Carbon Nitride Films,” Diamond and Related Materials, 8:1809-1830.
Ong, Soon-Eng et al. (2007) “Temperature effect on bonding structures of amorphous carbon containing more than 30at.% silicon,” Diamond & Related Materials, 16:1823-1827.
Singapore Examination Report dated Jun. 22, 2016 issued in Application No. SG 201300974-1.
Singapore Search Report and Written Opinion dated Dec. 15, 2015 issued in Application No. SG 201300974-1.
Subramonium et al., “Low Temperature Ashable Hardmask (AHMTM) Films for sub-45nm Patterning,” citation information unavailable, no date available, 3pp.
Taiwan Examination and Search Report, dated Oct. 4, 2016, issued in Application No. TW 102104640.
Taiwan Office Action, dated May 8, 2014, issued in Application No. TW 098142631.
Taiwanese First Office Action dated Apr. 9, 2018 issued in TW 103133764.
Taiwanese Notice of Allowance dated Apr. 26, 2017 issued in TW 103106336.
US Final Office Action, dated Apr. 12, 2011, issued in U.S. Appl. No. 11/849,208.
US Final Office Action dated Apr. 15, 2010 issued in U.S. Appl. No. 11/710,652.
US Final Office Action, dated Apr. 24, 2013, issued in U.S. Appl. No. 11/849,208.
US Final Office Action, dated Apr. 19, 2012, issued in U.S. Appl. No. 12/786,842.
US Final Office Action, dated Aug. 4, 2014, issued in U.S. Appl. No. 13/974,808.
US Final Office Action, dated Dec. 21, 2009, issued in U.S. Appl. No. 12/133,223.
US Final Office Action, dated Dec. 30, 2010, issued in U.S. Appl. No. 11/449,983.
US Final Office Action, dated Dec. 9, 2009, issued in U.S. Appl. No. 11/612,382.
US Final Office Action, dated Feb. 24, 2009, issued in U.S. Appl. No. 11/612,382.
US Final Office Action, dated Jul. 22, 2016, issued in U.S. Appl. No. 14/248,046.
US Final Office Action, dated Jul. 9, 2008, issued in U.S. Appl. No. 11/449,983.
US Final Office Action, dated Mar. 14, 2013, issued in U.S. Appl. No. 12/766,721.
US Final Office Action, dated May 12, 2009, issued in U.S. Appl. No. 11/612,382.
US Final Office Action, dated May 13, 2008, issued in U.S. Appl. No. 11/612,382.
US Final Office Action dated Oct. 18, 2012, issued in U.S. Appl. No. 12/163,670.
US Final Office Action, dated Oct. 24, 2007, issued in U.S. Appl. No. 11/263,148.
US Final Office Action, dated Oct. 9, 2015, issued in U.S. Appl. No. 14/270,001.
US Final Office Action, dated Sep. 14, 2012, issued in U.S. Appl. No. 11/849,208.
US Final Office Action, dated Sep. 15, 2009, issued in U.S. Appl. No. 11/449,983.
US Notice of Allowance and Allowed Claims dated Nov. 24, 2010 issued in U.S. Appl. No. 11/710,652.
US Notice of Allowance, dated Dec. 23, 2015, issued in U.S. Appl. No. 14/270,001.

(56) References Cited

OTHER PUBLICATIONS

US Notice of Allowance, dated Dec. 30, 2013, issued in U.S. Appl. No. 13/372,363.
US Notice of Allowance, dated Dec. 6, 2016, issued in U.S. Appl. No. 15/053,987.
US Notice of Allowance dated Jan. 3, 2013, issued in U.S. Appl. No. 12/163,670.
US Notice of Allowance, dated Jan. 7, 2008, issued in U.S. Appl. No. 11/318,269.
US Notice of Allowance, dated Jul. 1, 2013, issued in U.S. Appl. No. 13/371,184.
US Notice of Allowance, dated Jul. 20, 2012, issued in U.S. Appl. No. 12/786,842.
US Notice of Allowance, dated Jun. 28, 2013, issued in U.S. Appl. No. 12/766,721.
US Notice of Allowance, dated Mar. 16, 2011, issued in U.S. Appl. No. 11/449,983.
US Notice of Allowance, dated Mar. 18, 2008, issued in U.S. Appl. No. 11/263,148.
US Notice of Allowance, dated Mar. 2, 2010, issued in U.S. Appl. No. 12/133,223.
US Notice of Allowance, dated Mar. 22, 2011, issued in U.S. Appl. No. 11/710,377.
US Notice of Allowance, dated May 7, 2007, issued in U.S. Appl. No. 11/318,269.
US Notice of Allowance, dated Nov. 2, 2010, issued in U.S. Appl. No. 12/334,220.
US Notice of Allowance, dated Nov. 25, 2015, issued in U.S. Appl. No. 14/185,757.
US Notice of Allowance, dated Oct. 13, 2011, issued in U.S. Appl. No. 12/142,226.
US Notice of Allowance, dated Oct. 23, 2014, issued in U.S. Appl. No. 13/974,808.
US Notice of Allowance dated Oct. 25, 2013 issued in U.S. Appl. No. 13/032,392.
US Notice of Allowance, dated Oct. 31, 2016, issued in U.S. Appl. No. 14/248,046.
US Notice of Allowance, dated Oct. 4, 2006, issued in U.S. Appl. No. 11/318,269.
US Notice of Allowance, dated Oct. 7, 2011, issued in U.S. Appl. No. 12/048,967.
US Notice of Allowance dated Sep. 22, 2015, issued in U.S. Appl. No. 13/856,364.
US Office Action, dated Apr. 18, 2011, issued in U.S. Appl. No. 12/048,967.
US Office Action, dated Aug. 10, 2012, issued in U.S. Appl. No. 12/766,721.
US Office Action, dated Aug. 12, 2016, issued in U.S. Appl. No. 15/053,987.
US Office Action, dated Aug. 19, 2008, issued in U.S. Appl. No. 11/612,382.
US Office Action, dated Aug. 19, 2009, issued in U.S. Appl. No. 11/710,377.
US Office Action, dated Aug. 19, 2009, issued in U.S. Appl. No. 12/133,223.
US Office Action, dated Aug. 27, 2007, issued in U.S. Appl. No. 11/318,269.
US Office Action dated Aug. 5, 2010 issued in U.S. Appl. No. 11/710,652.
US Office Action, dated Aug. 6, 2015, issued in U.S. Appl. No. 14/185,757.
US Office Action, dated Dec. 14, 2006, issued in U.S. Appl. No. 11/318,269.
US Office Action dated, Dec. 27, 2007, issued in U.S. Appl. No. 11/449,983.
US Office Action, dated Feb. 14, 2012, issued in U.S. Appl. No. 12/163,670.
US Office Action, dated Feb. 15, 2013, issued in U.S. Appl. No. 13/371,184.
US Office Action, dated Feb. 28, 2014, issued in U.S. Appl. No. 13/974,808.
US Office Action, dated Jan. 14, 2016, issued in U.S. Appl. No. 14/248,046.
US Office Action, dated Jan. 5, 2009, issued in U.S. Appl. No. 11/449,983.
US Office Action, dated Jan. 5, 2009, issued in U.S. Appl. No. 11/710,377.
US Office Action, dated Jul. 6, 2012, issued in U.S. Appl. No. 12/163,670.
US Office Action dated Jul. 9, 2013 issued in U.S. Appl. No. 13/032,392.
US Office Action, dated Jun. 1, 2007, issued in U.S. Appl. No. 11/263,148.
US Office Action, dated Jun. 1, 2007, issued in U.S. Appl. No. 11/612,382.
US Office Action, dated Jun. 21, 2010, issued in U.S. Appl. No. 11/449,983.
US Office Action, dated Mar. 26, 2010, issued in U.S. Appl. No. 11/612,382.
US Office Action, dated Mar. 31, 2010, issued in U.S. Appl. No. 11/710,377.
US Office Action, dated May 15, 2015, issued in U.S. Appl. No. 14/270,001.
US Office Action, dated May 2, 2011, issued in U.S. Appl. No. 12/142,226.
US Office Action dated Nov. 20, 2009 issued in U.S. Appl. No. 11/710,652.
US Office Action, dated Nov. 22, 2010, issued in U.S. Appl. No. 12/048,967.
US Office Action, dated Nov. 9, 2011, issued in U.S. Appl. No. 12/786,842.
US Office Action, dated Oct. 19, 2011, issued in U.S. Appl. No. 12/163,670.
US Office Action, dated Oct. 9, 2007, issued in U.S. Appl. No. 11/612,382.
US Office Action, dated Oct. 9, 2013, issued in U.S. Appl. No. 13/372,363.
US Office Action, dated Sep. 3, 2010, issued in U.S. Appl. No. 11/849,208.
U.S. Appl. No. 11/710,652, filed Feb. 22, 2007, entitled "Improved Duffusion Barrier and Etch Stop Films" Superseded by U.S. Pat. No. 7,915,166.
U.S. Appl. No. 12/133,223, filed Jun. 4, 2008, entitled "Method for Purifying Acetylene Gas for Use in Semiconductor Processes" Superseded by U.S. Pat. No. 7,820,556.
U.S. Appl. No. 12/786,842, filed May 25, 2010, entitled "Method for Purifying Acetylene Gas for Use in Semiconductor Processes" Superseded by U.S. Pat. No. 8,309,473.
U.S. Appl. No. 13/371,184, filed Feb. 10, 2012, entitled "Method for Etching Organic Hardmasks" 2012/0149207, now U.S. Pat. No. 8,569,179.
U.S. Appl. No. 13/372,363, filed Feb. 13, 2012, entitled "Method for Etching Organic Hardmasks" Now. 2012/0196446.
U.S. Appl. No. 15/053,987, filed Feb. 25, 2016, entitled "PECVD Films for EUV Lithography." [2016/0179005].
U.S. Appl. No. 11/449,983, filed Jun. 8, 2006, entitiled "Methods of Depositing Highly Selective Transparent Ashable Hardmask Films." Superseded by U.S. Pat. No. 7,981,810.
U.S. Appl. No. 11/612,382, filed Dec. 18, 2006, entitled "Methods of Improving Ashable Hardmask Adhesion to Metal layers."
U.S. Appl. No. 11/710,377, filed Feb. 22, 2007, entitled "Methods of Depositing Stable and Hermetic Ashable Hardmask Films," pp. 1-26. Superseded by U.S. Pat. No. 7,981,777.
U.S. Appl. No. 11/849,208, filed Aug. 31, 2007, entitled "Methods and Apparatus for Plasma-Based Deposition."
U.S. Appl. No. 12/048,967, filed Mar. 14, 2008, entitled "Pulsed PECVD Method for Modulating Hydrogen Content in Hard Mask." Superseded by U.S. Pat. No. 8,110,493.
U.S. Appl. No. 12/163,670, filed Jun. 27, 2008, entitled "Methods of Depositing Smooth and Conformal Ashable Hard Mask Films" Superseded by U.S. Pat. No. 8,435,608.

(56) References Cited

OTHER PUBLICATIONS

U.S. Appl. No. 12/334,220, filed Dec. 12, 2008, entitled "Method for Improved Thickness Repeatability of PECVD Deposited Carbon Films." [see US Patent Publication No. 2010/0151691] Superseded by U.S. Pat. No. 7,955,990.
U.S. Appl. No. 12/766,721, filed Apr. 23, 2010, entitled "Methods for Forming Conductive Carbon Films by PECVD" Superseded by U.S. Pat. No. 8,563,414.
U.S. Appl. No. 13/032,392, filed Feb. 22, 2011, entitled "Improved Diffusion Barrier and Etch Stop Films" Superseded by U.S. Pat. No. 8,669,181.
U.S. Appl. No. 13/160,399, filed Jun. 14, 2011, entitled "Methods of Depositing Highly Selective Transparent Ashable Hardmask Films."
U.S. Appl. No. 13/856,364, filed Apr. 3, 2013, entitled "Methods of Depositing Smooth and Conformal Ashable Hard Mask Films" Now U.S. Pat. No. 9,240,320.
U.S. Appl. No. 13/974,808, filed Aug. 23, 2013, entitled "Methods and Apparatus for Plasma-Based Deposition" Now 2014/0057454; U.S. Pat. No. 8,962,101.
U.S. Appl. No. 14/185,757, filed Feb. 20, 2014, entitled "PECVD Films for EUV Lithography." [2014/0239462] [U.S. Pat. No. 9,304,396].
U.S. Appl. No. 14/248,046, filed Apr. 8, 2014, entitled High Selectivity and Low Stress Carbon Hardmask by Pulsed Low Frequency RF Power. Now 2015/0093908.
U.S. Appl. No. 14/270,001, filed May 5, 2014, entitled "Sulfur Doped Carbon Hard Masks." [2015/0093915] [U.S. Pat. No. 9,320,387].
US Supplemental Notice of Allowance, dated Feb. 8, 2011, issued in U.S. Appl. No. 12/334,220.
Van de Ven et al. (1990) "Advantages of Dual Frequency PECVD for Deposition of ILD and Passivation Films," VLSI Multilevel Interconnection Conference Proceedings, Seventh International IEEE, 194-201.
Voronkin et al. (1994) "Structure and mechanical properties of a-C:H films deposited onto polymer substrates: Diamond and Related Materials," 4:5-9.
CN Office Action dated Jan. 9, 2024 in CN Application No. 202080039821.X with English translation.
EP Extended European Search Report dated Jul. 27, 2023, in Application No. EP20855963.3.
International Preliminary Report on Patentability dated Apr. 6, 2023 in Application No. PCT/US2021/051776.
International Preliminary Report on Patentability dated Jun. 29, 2023, in Application No. PCT/US2021/063109.
International Preliminary Report on Patentability dated Sep. 22, 2022, in PCT Application No. PCT/US2021/022162.
International Search Report and Written Opinion dated Apr. 14, 2022, for International Application No. PCT/US2021/063109.
International Search Report and Written Opinion dated Jan. 10, 2022, in Application No. PCT/US2021/051776.
International Search Report and Written Opinion dated Jul. 7, 2021 in PCT Application No. PCT/US2021/022162.
International Search Report and Written Opinion dated Sep. 15, 2023 in PCT Application No. PCT/US2023/022327.
KR Office Action dated Dec. 9, 2022, in Application No. KR10-2022-0119327 with English translation.
KR Office Action dated Dec. 14, 2022 in Application No. KR10-2022-0049352 With English Translation.
KR Office Action dated Dec. 15, 2023 in KR Application No. 10-2023-0138917, with English Translation.
KR Office Action dated Jul. 13, 2022 in Application No. KR10-2022-0031478 with English translation.
KR Office Action dated Jun. 21, 2022, in Application No. KR10-2014-0130444 with English translation.
Tomasella E et al., "a-C:H thin films deposited by radio-frequency plasma: influence of gas composition on structure, optical properties and stress levels," Surface and Coatings Technology, Elsevier, NL, Jun. 18, 2001, vol. 141, pp. 286-296.
U.S. Non Final Office Action dated Mar. 16, 2023 in U.S. Appl. No. 17/595,505.
U.S. Notice of Allowance dated Jul. 20, 2023, in U.S. Appl. No. 17/595,505.
U.S. Notice of Allowance dated Nov. 9, 2023, in U.S. Appl. No. 17/595,505.
U.S. Appl. No. 17/905,955, inventors Reddy et al., filed Sep. 9, 2022.
U.S. Appl. No. 18/493,614, inventors Weimer M S, et al., filed Oct. 24, 2023.
SG Search report and Written Opinion dated May 17, 2024 in SG Application No. 11202201891Q.
CN Office Action dated Oct. 12, 2024 in CN Application No. 202080039821.X with English translation.
KR Office Action dated Sep. 19, 2024 in KR Application No. 10-2022-7010538 with English Translation.
KR Office Action dated Sep. 27, 2024 in KR Application No. 10-2023-0138917 with English Translation.
U.S. Appl. No. 18/863,211, inventors Lill T, et al., filed Nov. 5, 2024.
CN Office Action dated Dec. 26, 2024 in CN Application No. 202080061227.0, with English Translation.
International Search Report and Written Opinion dated Jan. 11, 2022, in Application No. PCT/US2021/052250.
International Preliminary Report on Patentability dated Apr. 13, 2023, in PCT Application No. PCT/US2021/052250.
CN Office Action dated Feb. 20, 2025 in CN Application No. 202080039821.X, with English Translation.
JP Office Action dated Apr. 8, 2025 in JP Application No. 2023-518084, with English Translation.
KR Office Action dated Apr. 7, 2025 in KR Application No. 10-2022-7010538, with English Translation.
TW Office Action and Search Report dated Apr. 2, 2025 in TW Application No. 110135982, with English Translation.
TW Office Action and Search Report dated Feb. 18, 2025 in TW Application No. 110147200, with English Translation.
TW Office Action dated Mar. 24, 2025 in TW Application No. 110135532, with English Translation.
U.S. Restriction Requirement dated Mar. 26, 2025 in U.S. Appl. No. 18/245,950.
JP Office Action dated Jun. 24, 2025 in JP Application No. 2023519425, with English Translation.
KR Office Action dated Jul. 31, 2025 in KR Application No. 10-2022-7044415 with English translation.
KR Office Action dated May 27, 2025 in KR Application No. 10-2021-7042951, with English Translation.
U.S. Restriction Requirement dated Aug. 7, 2025 in U.S. Appl. No. 18/247,060.
U.S. Restriction Requirement dated Jun. 2, 2025 in U.S. Appl. No. 17/905,955.
U.S. Restriction Requirement dated Jun. 13, 2025 in U.S. Appl. No. 18/256,893.
CN Office Action dated Jun. 29, 2025 in CN Application No. 202080061227.0, with English Translation.

* cited by examiner

HIGH DENSITY, MODULUS, AND HARDNESS AMORPHOUS CARBON FILMS AT LOW PRESSURE

INCORPORATED BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Amorphous carbon films may be used as hard masks and etch stop layers in semiconductor processing, including in memory and logic device fabrication. These films are also known as ashable hard masks (AHMs) because they may be removed by an ashing technique. As aspect ratios in lithography increase, AHMs require higher etch selectivity. Current methods of forming highly selective AHMs using plasma enhanced chemical vapor deposition (PECVD) processes result in AHMs with high stress, limiting the AHMs' usefulness as hard masks. Accordingly, it is desirable to produce AHMs having high etch selectivity, but low stress.

Background and contextual descriptions contained herein are provided solely for the purpose of generally presenting the context of the disclosure. Much of this disclosure presents work of the inventors, and simply because such work is described in the background section or presented as context elsewhere herein does not mean that it is admitted to be prior art.

SUMMARY

Disclosed herein are methods and systems for depositing an ashable hard mask (AHM) in a low pressure environment. In some aspects of the embodiments herein, a method is provided, including: exposing a semiconductor substrate in a chamber to a process gas including a hydrocarbon precursor gas and helium gas, substantially without any other inert gas; and depositing on the substrate an ashable hard mask (AHM) film by a plasma enhanced chemical vapor deposition (PECVD) process, wherein the PECVD process includes: maintaining the chamber pressure at less than 500 mTorr; igniting a plasma generated by a dual radio frequency (RF) plasma source including a high frequency (HF) component and a low frequency (LF) component. In some embodiments, the chamber pressure is between about 3 and 30 mTorr. In some embodiments, the HF power is at least about 50 W. In some embodiments, the HF power is between about 50 W and 700 W. In some embodiments, the HF power has a frequency between about 2 MHz and about 100 MHz. In some embodiments, the HF power has a frequency of about 60 MHz.

In some embodiments, the LF power has a frequency between about 100 kHz and about 2.4 MHz. In some embodiments, the LF power has a frequency of about 400 KHz. In some embodiments, the LF power is less than 4000 W. In some embodiments, the LF power is 0 W. In some embodiments, the LF power is between 50 and 500 W. In some embodiments, the LF power is between 50 and 250 W. In some embodiments, the LF power is between 250 and 500 W. In some embodiments, the HF power is between about 50 and 150 W, and the LF power is between about 50 and 500 W. In some embodiments, a direct current bias is applied to an electrostatic chuck that the semiconductor substrate rests upon during the PECVD process, and the potential of the DC bias may be between 100V to 10000V. In some embodiments, the direct current bias has a duty cycle between about 10% and about 90%, and a repetition rate between about 100 Hz and 10 kHz.

In some embodiments, a deposition rate of the AHM is at least 350 Å/min. In some embodiments, the chamber includes an electrostatic chuck that the semiconductor substrate rests upon during the PECVD process, and the electrostatic chuck temperature is between −20° C. and 175° C. In some embodiments, the electrostatic chuck temperature is between 80° C. and 125° C. In some embodiments, further including annealing the AHM at a temperature of at least 500° C. In some embodiments, the hydrocarbon precursor gas comprises compounds having a molecular weight of at most about 50 g/mol. In some embodiments, the hydrocarbon precursor gas comprises compounds having a C:H ratio of at least 0.5. In some embodiments, the hydrocarbon precursor gas comprises acetylene ($C_2H_2$). In some embodiments, the modulus of the AHM film is at least about 120 GPa. In some embodiments, the hardness of the AHM film is at least about 12 GPa. In some embodiments, the $sp^3$ content of the AHM film is at least about 67%. In some embodiments, the density of the AHM film is at least about 1.8 $g/cm^3$. In some embodiments, the thickness of the AHM film is at least about 0.1 μm.

In some embodiments, the method further includes patterning the deposited AHM film and etching the patterned AHM film to define features of the AHM film in the substrate. In some embodiments, the method further includes etching layers in the substrate underlying the AHM film. In some embodiments, the method further includes, before depositing the AHM film, depositing on the substrate an interfacial layer by a PECVD process, wherein depositing the interfacial layer comprises: igniting a plasma generated by the dual RF plasma source, wherein the HF component and the LF are at a lower power than during deposition of the AHM film.

In some embodiments, the method further includes treating the AHM to ash no more than 10 nm of the AHM to remove a crust layer. In some embodiments, the method further includes treating the AHM to densify a crust layer by bombarding the AHM with a process gas that does not include a hydrocarbon precursor. In some embodiments, the method further includes removing hydrocarbon precursor from the process chamber prior to lowering the power of the HF component and/or the LF component. In some embodiments, the method further includes cleaning the chamber using a discard-able wafer as a cover for an electrostatic chuck. In some embodiments, the method further includes depositing a layer of $SiO_2$ on any plasma facing components within the process chamber.

These and other features of the disclosed embodiments will be described in detail below with reference to the associated drawings.

DETAILED DESCRIPTION

Introduction and Context

In semiconductor processing, masking methods are used to pattern and etch substrates. As substrate aspect ratios increase, the demand for highly selective hard masks increases. Masks that have high etch selectivity and yet are easy to remove without damage to the substrate are important to processing substrates. Ashable hard masks (AHMs) can be used as masks in etch stop layers, during selective etching, for high aspect-ratio (HAR) etching, or where a photoresist may not be thick enough to mask the underlying layer. AHMs may also be used on glass substrates used for displays and other technologies.

AHM films have a chemical composition that allows them to be removed by a technique referred to as "ashing," "plasma ashing," or "dry stripping" once they have served their purpose. One example of an AHM film is an amorphous carbon layer or film. An AHM film is generally composed of carbon and hydrogen with, optionally, a trace amount of one or more dopants (e.g., nitrogen, fluorine, boron, and silicon). The bonding structure of an AHM can vary from $sp^2$ (graphite-like) or $sp^3$ (diamond-like), or a combination of both, depending on the deposition conditions.

Figure 1:
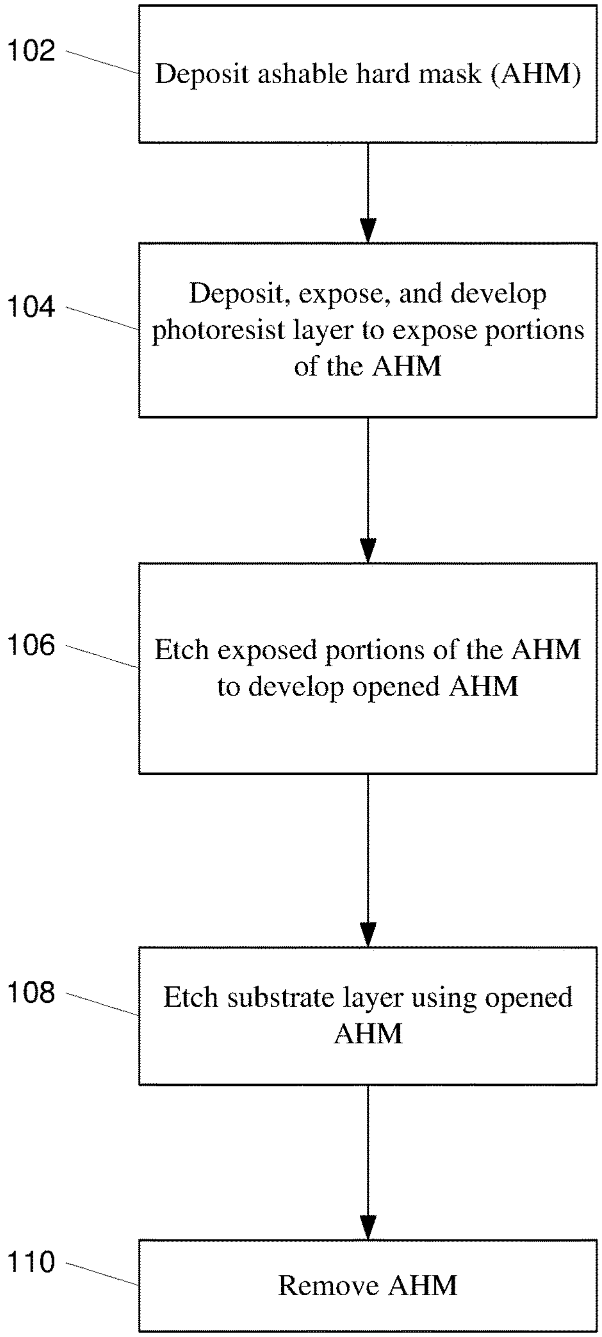
FIG. 1 is a process flow diagram showing relevant operations of methods of using ashable hard masks in etching operations according to various embodiments.

FIG. 1 is a process flow diagram showing relevant operations of methods of using an AHM as a hard mask in etching operations. While the description below refers chiefly to semiconductor substrates, the methods may also be applied to layers on other types of substrates including glass substrates. Examples of materials that may be masked with the AHM include dielectric materials such as oxides (e.g., $SiO_2$) and nitrides (e.g., SiN and TiN), polysilicon (Poly-Si), and metals such as aluminum (Al), copper (Cu), and tungsten (W). In certain embodiments, the AHMs described herein are used to pattern oxides, nitrides, or polysilicon layers.

In operation 102, an ashable hard mask is deposited on the layer to be etched by plasma enhanced chemical vapor deposition (PECVD). PECVD processes involve generating plasma in the deposition chamber. As described further below with reference to FIG. 2, a dual radio frequency (RF) plasma sources that include a high frequency (HF) power and a low frequency (LF) power may be used. In some processes, one or more AHM layers are deposited.

In operation 106, a photoresist layer is deposited, exposed, and developed in accordance with the desired etch pattern. In some implementations, an anti-reflective layer (ARL) may be deposited on the AHM film prior to photoresist deposition.

In operation 108, the AHM film is opened by etching the exposed portions of the AHM. Opening the AHM may be performed by a fluorine-rich dry etch.

Next, in operation 110, the substrate layer is selectively etched to transfer the pattern to the substrate layer. The selective etch may be performed such that the substrate layer is etched without substantially diminishing the AHM walls. Examples of etches can include radical and/or ionic-based etches. Examples of etch chemistries can include halogen-based etch chemistries such as fluorine-containing and chlorine-containing etch chemistries. For example, capacitively-coupled plasmas generated from fluorocarbon-containing process gases may be used to selectively etch oxide layers. Specific examples of process gases include $C_xF_y$-containing process gases, optionally with oxygen ($O_2$) and an inert gas, such as $C_4H_8/CH_2F_2/O_2/Ar$.

Lastly, in operation 112, a technique referred to as ashing, plasma ashing, or dry stripping is used to remove the AHM. Ashing may be performed by an oxygen-rich dry etch. Often, oxygen is introduced in a chamber under vacuum and RF power creates oxygen radicals in plasma to react with the AHM and oxidize it to water ($H_2O$), carbon monoxide (CO), and carbon dioxide ($CO_2$). Optionally, any remaining AHM residue may also be removed by wet or dry etching processes after ashing. The result is a patterned substrate layer.

As the depth and/or aspect ratios for HAR etching increase, the etch selectivity or thickness of the AHM must also increase. Etch selectivity can be determined by comparing the etch rate of the AHM layer to an underlying layer. The etch selectivity can sometimes be approximated by determining the hydrogen content, refractive index (RI), density, and modulus, or rigidity, of the AHM layer. Typically, an AHM having lower hydrogen content, lower RI, higher density, and higher modulus is able to withstand higher etch rates in an etch process involving ion bombardment. Therefore, AHMs with lower hydrogen content, lower RI, higher density, and/or higher modulus have a higher selectivity and lower etching rate, and thus can be used more efficiently and effectively for HAR semiconductor processes. The desired etch selectivity of the AHM may depend on the etching process and the composition of the underlying layers, but the correlation between etch selectivity and the material properties above remains the same regardless of the etching process or composition of the underlying layers. The selectivity correlations as described here applies to all types of underlying layers, including polysilicon layers, oxide layers, and nitride layers.

Figure 2B:
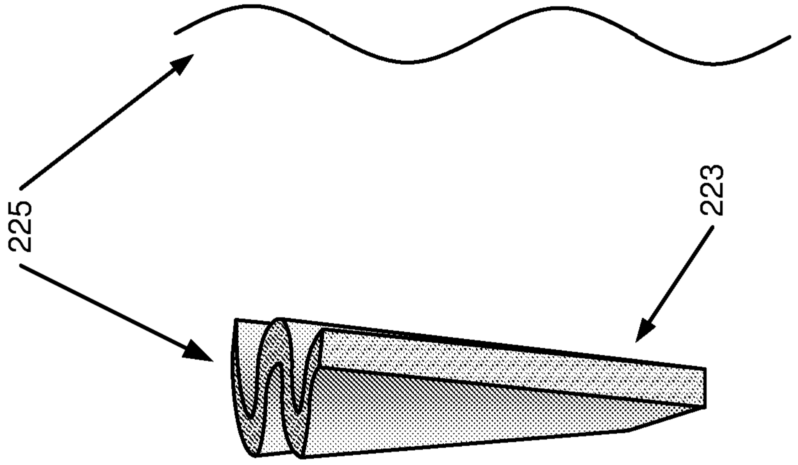
FIGS. 2A and 2B are illustrations of line-bending of a patterned ashable hard mask (AHM).
Figure 2A:
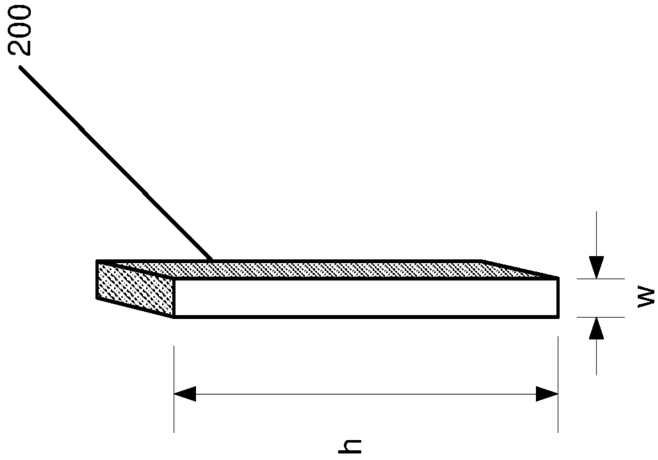

The thickness of the AHM may also be increased, but that may present issues in the resultant features. The thickness of the AHM can be directly related to line-bending or hole twisting, or the distortion of features after the pattern has been etched into a stack of films. FIGS. 2A-B are illustrations of line-bending of a resist. FIG. 2A shows a feature 200 of a patterned AHM having a height, or thickness, 'h' and a line width 'w'. FIG. 2A has no line bending, which is the ideal condition for features of an AHM and an underlying substrate layer. FIG. 2B shows the same feature but with significant line-bending, which may have a vertical aspect 223 and a horizontal aspect 225. As illustrated, line-bending may manifest as a curved, angled, or otherwise bent horizontal component. In some cases, line-bending is manifest as vertical component that deviates from perpendicular (normal) to a plane of the substrate on which the line is formed. In the depicted embodiment, the line has a fan-like shape. Line-bending is undesirable for various reasons, among which are that it increases the line edge roughness (LER) and line width roughness (LWR) and reduces the critical dimension uniformity (CDU) of the AHM and underlying layers etched using the AHM. In general, line bending may cause distortion of features during and after the pattern has been etched into a stack of films.

Line-bending of an AHM can be roughly modeled by the following equation:

$$\text{Line bending propensity} \propto \frac{\sigma}{E}\left(\frac{h}{w}\right)^2$$

Where σ and E are the internal compressive stress and modulus of the AHM, respectively. This equation demonstrates that line-bending is directly related to stress and height, increasing with higher stress or height, (i.e. thickness), while inversely related to modulus and width, decreasing with increased modulus or width. As features size shrinks, the width of AHM features decrease to meet new critical dimension requirements. Furthermore, the required thickness of the AHM for an etch process is inversely proportional to its selectivity; higher selectivity allows for a thinner AHM, and lower selectivity requires a thicker AHM. Thus, line-bending may be reduced by increasing the modulus or reducing the thickness, but reducing the thickness requires increasing selectivity.

According to various embodiments, methods of forming AHM films produce films having high selectivity. An AHM film deposition technique deposits the AHM film at a low pressure. As pressure decreases, the carbon ion energy increases, which improves density. The low pressure environment reduces the number of collisions between ions, increasing the acceleration felt by these ions and more efficiently transferring the ions to the depositing film.

Figure 3:
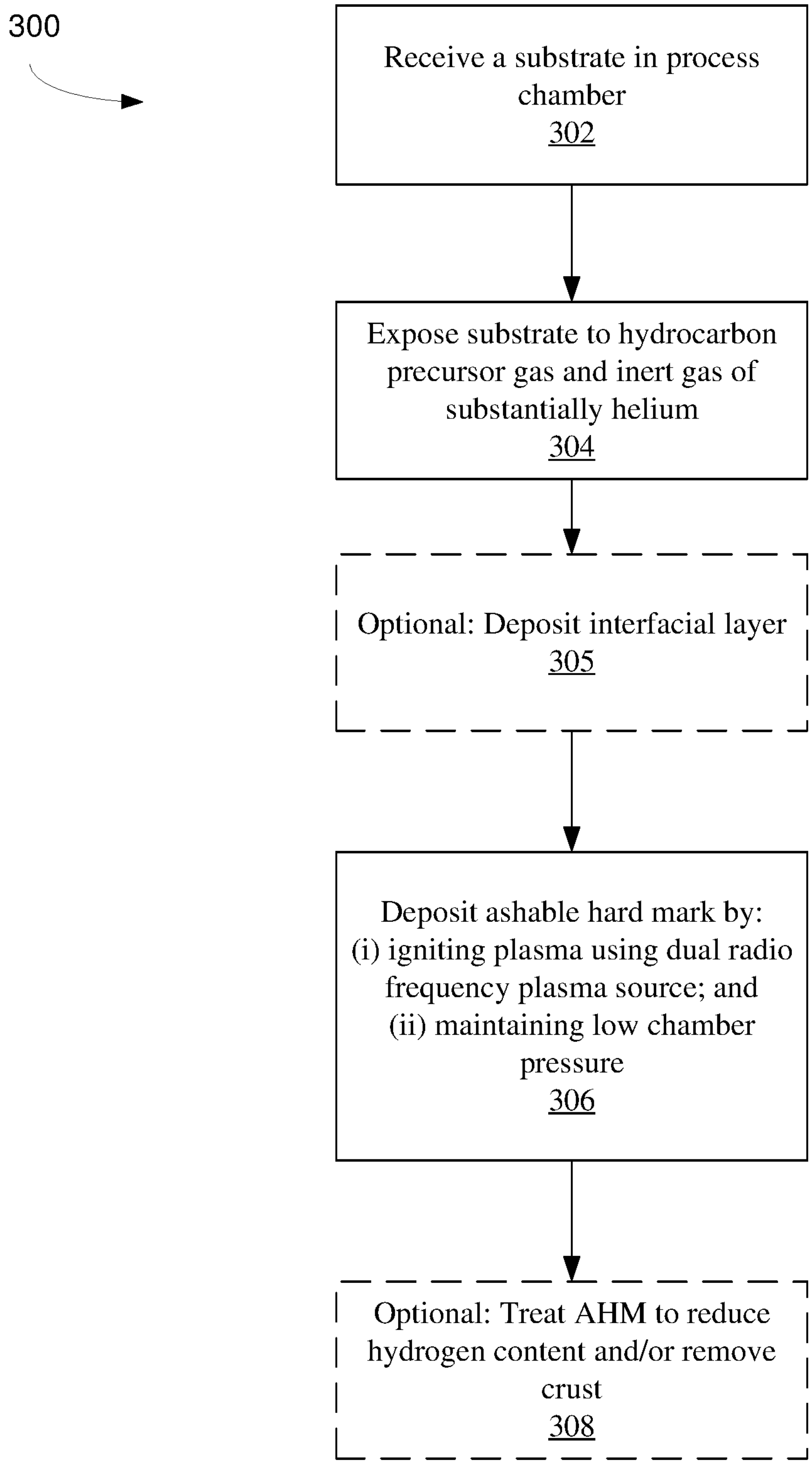
FIG. 3 is a process flow diagram showing relevant operations of methods of forming ashable hard masks by generating a plasma at low pressure according to various embodiments.

FIG. 3 shows a process flow diagram 300 showing relevant operations of methods of forming AHMs at low pressure according to various embodiments. In operation 302 a substrate is received in a process chamber. The substrate may be provided to the chamber in this operation, or the substrate may already be in the chamber from a prior operation. In operation 304 the substrate is exposed to a process gas including a hydrocarbon precursor. In addition to hydrocarbon precursors, an inert gas carrier may be used. The inert gas may include helium (He), neon (Ne) argon (Ar), krypton (Kr), xenon (Xe), nitrogen ($N_2$), hydrogen ($H_2$), or a combination of any of these. In some embodiments the inert gas is substantially helium, i.e. helium with trace amounts of other inert gases. Furthermore, the chamber pressure may be a low pressure. In some embodiments, the chamber pressure may change between operations of process flow diagram 300.

Operation 305 is an optional operation to deposit an interfacial layer. An interfacial layer may be deposited using a similar process as described below in operation 306, however the process is adjusted to reduce the ion energy so as to reduce sputtering and inhibit the creation of a film that incorporates an underlying substrate layer, such as by creating a silicon carbide layer. An interfacial layer may be deposited with a lower LF power and/or lower HF power, which reduces the carbon ion energy and deposits a film having lower etch selectivity than the remaining AHM deposited on it, but also has less of the underlying substrate layer, such as a silicon layer, in the film than if a higher LF power and HF power were used.

Next, in operation 306, an ashable hard mask is deposited on the substrate by a PECVD process by igniting plasma using a dual RF plasma source to produce a plasma having a HF component and optionally a LF component in a low pressure chamber. The low pressure environment reduces the number of collisions an ion experiences, increasing the ion energy, and leading to a denser AHM. In some embodiments the LF power is zero, and only HF power is used to produce the plasma. The result of operation 306 is an AHM film.

Finally, operation 308 is an optional operation to treat the AHM film. In some embodiments, treating the AHM film involves annealing the film. Annealing may cause hydrogen to desorb from the film, reducing the overall hydrogen content, which is generally desirable to increase etch selectivity.

In other embodiments, treating the AHM film involves an etching or ashing operation to remove a 'crust' that may form on top of the AHM. An ashing operation performed at low HF power and low or zero LF power may be used to remove the crust without removing the high density, bulk film. In some embodiments, both annealing and ashing may be performed to treat the AHM in operation 308.

Process Mechanism

Low pressure plasma enhanced chemical vapor deposition (PECVD) may be advantageous as the low pressure environment reduces the collisions between ions and other particles, increasing the ion energy felt by the substrate during the deposition process. In some embodiments, HF power, LF power, and process temperature may be controlled to adjust various film properties, including modulus, hardness, hydrogen content, and deposition rate. Low pressure PECVD may also cause sputtering and undesirable layers to form either between the AHM and an underlying substrate layer or as a 'crust' layer on top of the AHM.

Figure 4:
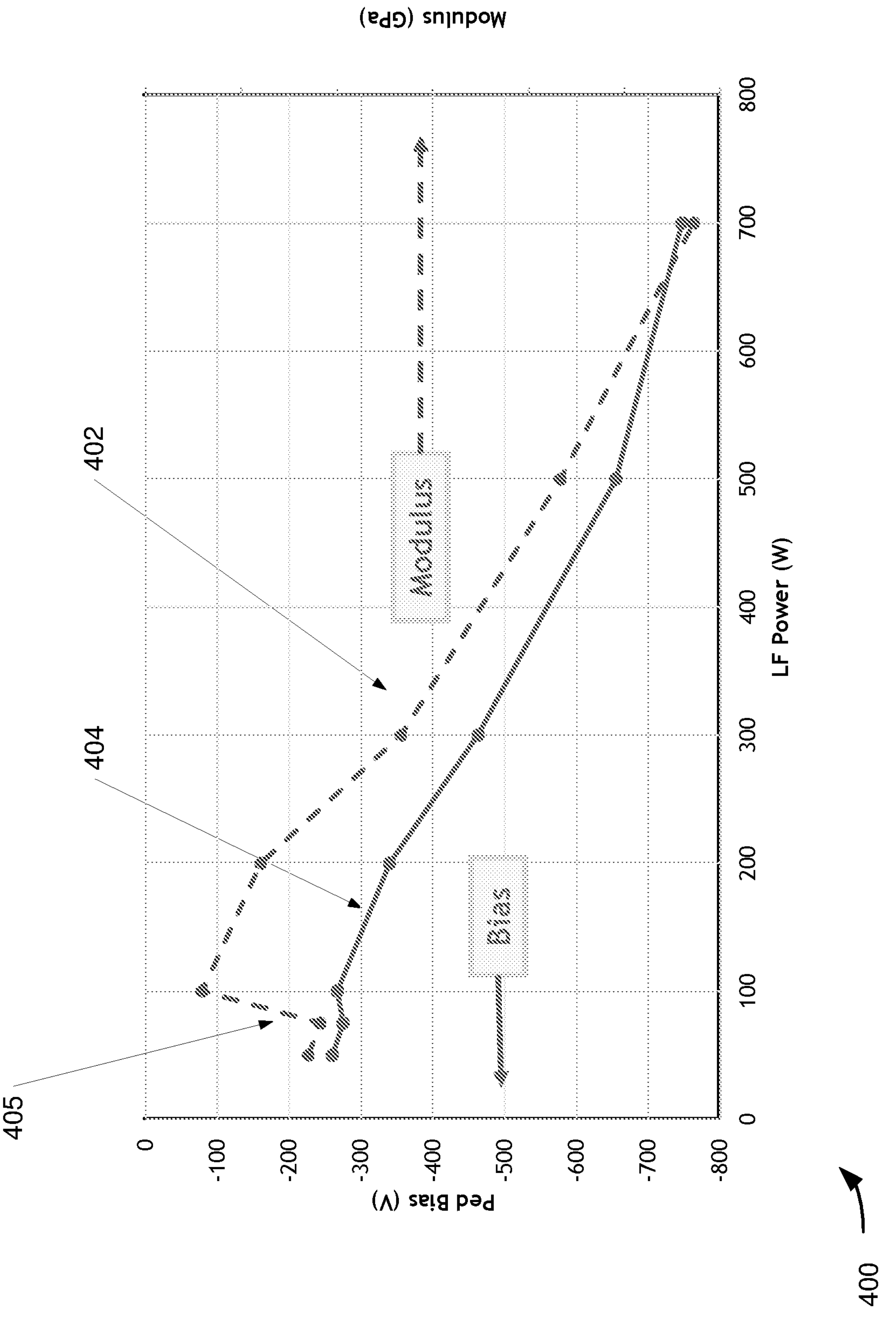
FIG. 4 shows a graph pedestal bias and film modulus as a function of LF power for various embodiments.

FIGS. 4-8 demonstrate how modulus may be controlled by LF power, HF power, pressure, and temperature. As noted above, modulus can generally be used as a proxy for the etch selectivity of a material, with higher modulus indicating higher selectivity. FIG. 4 presents a graph 400 of pedestal bias and modulus of an AHM as a function of LF power. Line 402 represents modulus measurements, and line 404 represents pedestal bias.

Graph 400 generally demonstrates that bias correlates strongly with LF power. Increasing the LF power will increase the negative voltage bias of the pedestal, which creates a larger potential drop in the plasma sheath to accelerate ions. Additionally, modulus is also correlated with LF power, where increasing LF power decreases modulus. Without being bound by theory, above a certain threshold, the larger voltage bias caused by the LF power causes the ions to sputter the growing film, reducing the modulus. This may also explain spike 405, which is indicative of the carbon ion energy having insufficient energy to densify or sputter the growing film below about 100 W LF power given the other process conditions, but having sufficient ion energy to densify the film at or above 100 W. The ion energy may be increased by tuning various parameters as described herein, including increasing LF or HF power or decreasing pressure.

Figure 5:
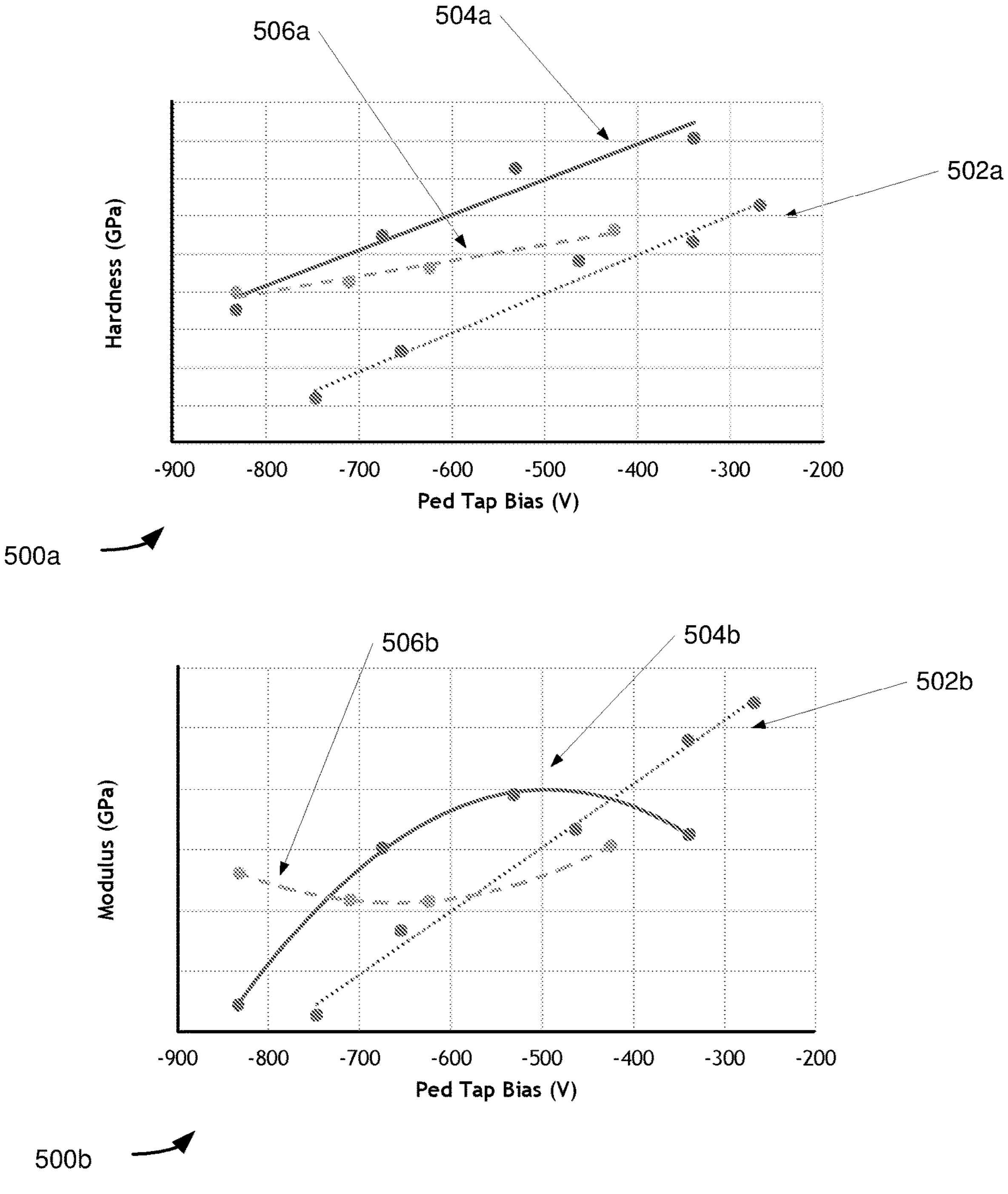
FIG. 5 shows a graph of hardness as a function of pedestal bias and a graph of modulus as a function of pedestal bias for various embodiments.

FIG. 5 presents two graphs, graph 500*a* and graph 500*b*. Both graphs provide data on the same or similar films. Graph 500*a* is hardness of the AHM film as a function of the pedestal voltage bias for films deposited at three different pressures: 5 mTorr (line 502*a*), 10 mTorr (line 504*a*), and 15 mTorr (line 506*a*). Graph 500*b* illustrates modulus as a function of pedestal bias for the same three different pressures: 5 mTorr (line 502*b*), 10 mTorr (line 504*b*), and 15 mTorr (line 506*b*). Notably, graph 500*a* demonstrates that line 502*a* has the steepest slope, or that the hardness of a film deposited at 5 mTorr has the greatest change based on the voltage bias. Lines 504*a* and 506*a* had successively smaller slopes, but depositing at 10 mTorr resulted in the highest hardness value.

In contrast, graph 500*b* shows that depositing at 5 mTorr provides better modulus than 10 mTorr or 15 mTorr. Line 502*b* has the highest modulus, and exhibits a linear correlation between bias and modulus. Line 504*b* exhibits a parabolic correlation, suggesting a local maxima of pedestal bias, or LF power, for achieving the highest modulus. Finally, line 506*b* has a relatively flat correlation between bias and modulus, suggesting bias, or LF power, may not have a large effect on modulus at lower bias and higher pressure (such as 15 mTorr or above). This may be advantageous in embodiments where process parameters that have a large effect on the pedestal bias, such as LF power, may be adjusted to optimize for other film properties without affecting modulus.

Figure 6:
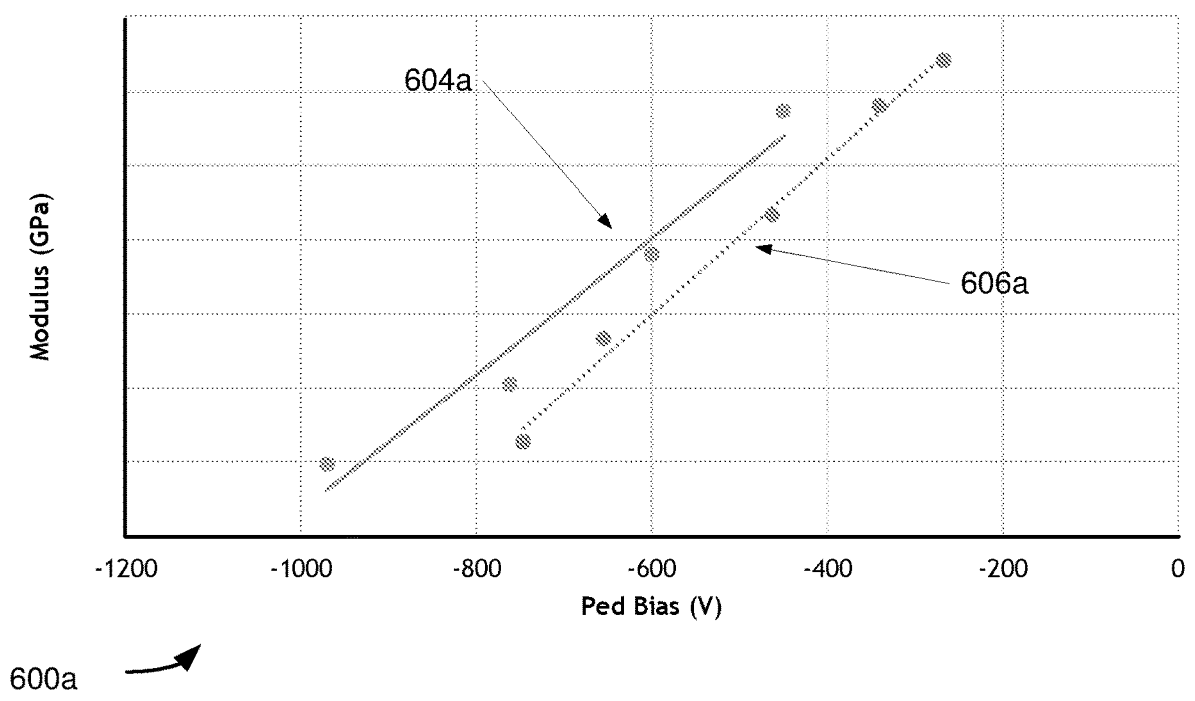
FIG. 6 shows a graph of modulus as a function of pedestal bias for depositing at different high frequency (HF) power and a graph of pedestal bias and modulus as a function of HF power, according to various embodiments.
Figure 6:
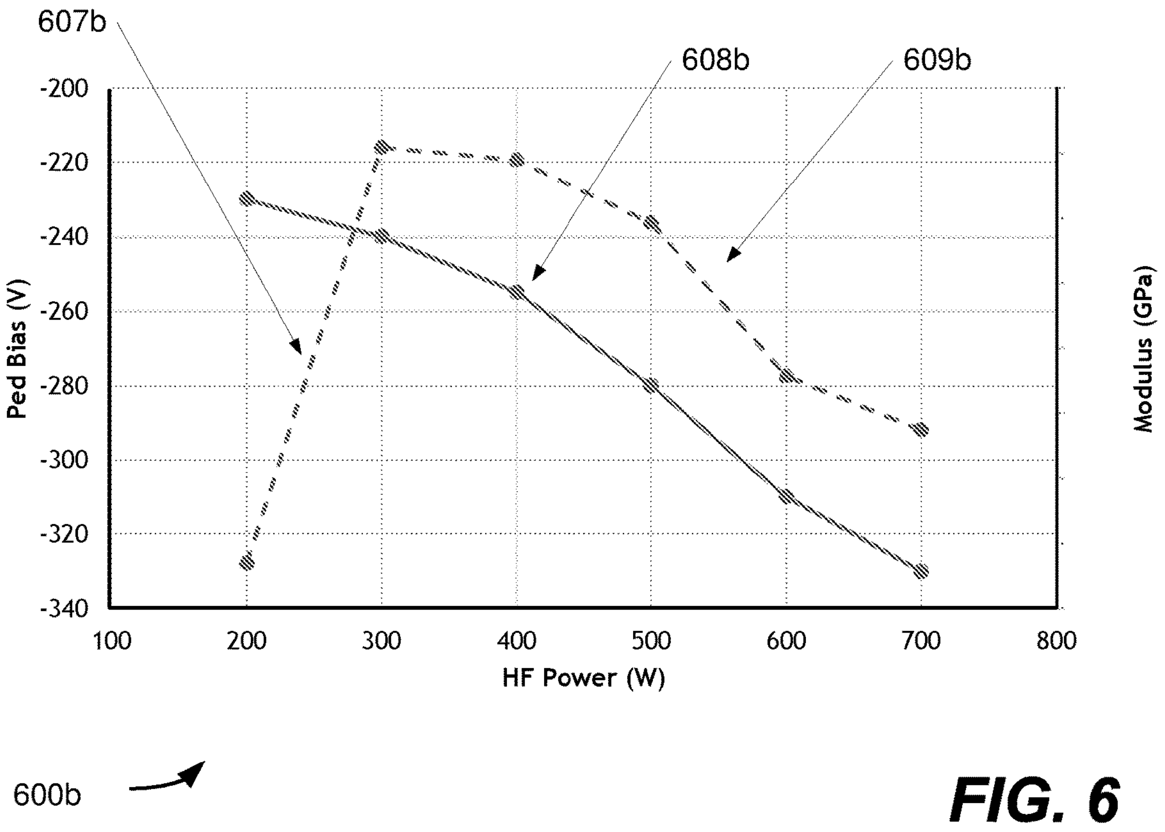

FIG. 6 presents two graphs, graph 600*a* and graph 600*b*, which illustrate the effect of HF power on modulus and pedestal bias. Graph 600*a* demonstrates modulus as a function of voltage bias for two different HF powers. Line 604*a* is for films deposited at 5 mTorr and 100 W HF, while line 606*a* is for films deposited at 5 mTorr and 500 W HF. Line 604*a* and 606*a* have similar slopes, but line 604*a* has a higher offset, i.e. for a given pedestal bias, depositing at 100 W HF power produces a film with a higher modulus than 500 W. Furthermore, similar to FIGS. 4 and 5, lower bias results in a higher modulus film.

Graph 600*b* presents pedestal bias, line 608*b*, and modulus, line 609*b*, as a function of HF power. Similar to FIG. 4, there is a spike 607*b*, where modulus drastically increases before falling off as HF power increases. Without being bound by theory, similar to FIG. 4, spike 607*b* may result from the ions having insufficient energy to densify the growing film, resulting in a lower modulus film. As the HF power increases to 300 W, the ions may have sufficient energy to densify the film. Generally, higher HF power decreases the modulus of the resulting film, subject to sufficient energy to overcome spike 607*b* at lower HF power.

Notably, line 608*b* demonstrates that pedestal bias will increase with increasing HF power. However, the effect of HF power on pedestal bias is much less intense than LF power. As may be noted by line 608*b*, an increase in HF power from 300 W to 500 W results in a change of pedestal bias from about −240 to −280, a −40V change. As may be seen in FIG. 4, a change in LF power from 300 W to 500 W results in a change of pedestal bias from about 450V to 650V, a −200V change.

Figure 7:
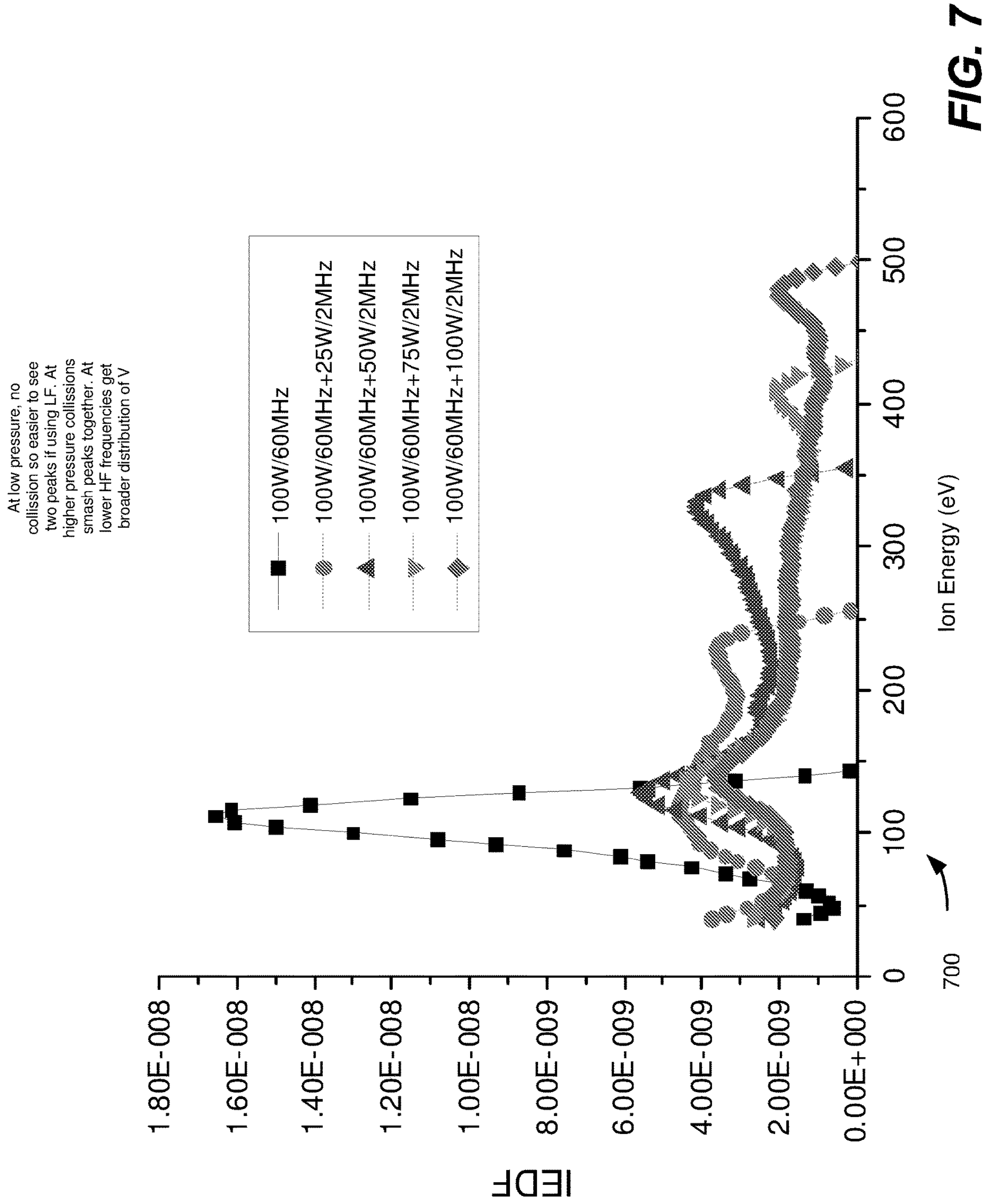
FIG. 7 shows a graph of ion energy distributions at various HF and low frequency (LF) powers.

FIG. 7 presents a graph 700 of ion flux as a function of ion energy. Five different HF and LF power combinations are graphed. Generally, each line includes a plasma having a HF component at 100 W and 60 MHz. A 2 MHz LF component is then added and stepped up incrementally by 25 W to a 100 W 60 MHz HF component and a 100 W 2 MHz LF component. These measurements were taken while operating at a pressure that allows for a collision-free environment. Generally, a higher pressure may cause a more even ion energy distribution due to collision effects.

As may be understood by graph 700, with only an HF component, the ion flux has a single peak around 100 eV. Adding a LF component causes the ion flux to follow a bimodal distribution, with one peak at about 100 eV, and another peak at progressively higher ion energies. For example, adding a 50 W LF component causes one peak at about 130 eV and a second peak at about 340 eV. Likewise, adding a 100 W LF component causes one peak at about 140 eV and a second peak at about 470 eV.

As noted by the spikes in FIGS. 4 and 6, a minimum ion energy is necessary to densify an AHM film. In some implementations, an ion energy of about 100 eV, per carbon atom, or higher causes densification of the film, which is desirable. Generally, increasing the frequency of either the HF or LF component will decrease the spread of ion energies. Furthermore, at higher HF component frequencies, increasing pressure will increase the neutral species density, while at lower HF component frequencies, such as 27 MHz, increasing pressure will also increase ion density. This may be desirable to control the ion to neutral ratio during the deposition process. High neutral deposition in the film will decrease modulus and density, so a lower ratio of neutral flux to ion flux is desirable.

Instead of, or in addition to, using LF power, a direct current (DC) bias may be applied to the ESC to cause a negative potential. The ion energy may increase with larger DC bias. A DC bias may achieve a similar affect in graph 700 as LF power, namely a bimodal distribution, but the distribution will be less uniform than shown in graph 700, such that there is a smaller spread around the ion flux caused by the HF power, and the ion flux caused by the DC bias. In embodiments using a DC bias, the DC bias may be pulsed. This may be advantageous to inhibit the growing AHM from insulating the ESC and preventing the DC bias from affecting the plasma.

In addition to HF power and LF power, temperature may be adjusted for a low pressure PECVD process. Increasing the process temperature generally decreases the hydrogen content of the film. Generally, a lower hydrogen content is more desirable. However, thermal removal of hydrogen may result in carbon-carbon double bond, or $sp^2$, formation, which is undesirable. When the deposition temperature of pure carbon films is too high, $sp^2$ carbon formation becomes spontaneous and the density of the film suffers greatly.

The table below presents a variety of film properties for four different films deposited at different temperatures, according to various embodiments herein. Each film was deposited at a pressure of 5 mTorr, with a process gas flow of 50 sccm $C_2H_2$ and 100 sccm He, with an HF power of 100 W at 60 MHz, and an LF power of 200 W at 400 kHz. k is the extinction coefficient, which indicates the transparency of the film. H % is the percent of hydrogen in the AHM, as measured using hydrogen forward scattering. RI is refractive index. ESC/SHD stand for the electrostatic chuck and the showerhead (or top electrode), respectively.

| ESC/ SHD Temp (° C.) | Dep Rate (Å/min) | RI @ 633 nm | Stress (MPa) | k @ 633 nm | Hardness (GPa) | Modulus (GPa) | H % RBS/ HFS |
|---|---|---|---|---|---|---|---|
| 20/2 | 402.1 | 2.375 | −1757 | 0.19 | 19.9 | 178.6 | 25.7 |
| 20/40 | 410.7 | 2.385 | −1755 | 0.21 | 23.0 | 179.7 | 25.9 |
| 40/80 | 394.1 | 2.393 | −1743 | 0.22 | 23.3 | 177.1 | 24.6 |
| 80/110 | 357.2 | 2.411 | −1759 | 0.23 | 23.7 | 178.3 | 24.3 |

Notably, as the temperature of the substrate rises, the hydrogen content decreases, dropping from 25.7% to 24.3%. Other parameters, such as hardness and refractive index, also improved, which is believed to result from the lower hydrogen content. Modulus and stress were unaffected by depositing at different temperatures. On the other hand, one drawback to depositing at higher temperature is a loss in the deposition rate.

Additionally, at higher temperature the amount of $sp^2$ content, or graphite-like carbon, increases. Typically, $sp^2$ is undesirable, as graphite-like carbon has a lower etch selectivity, e.g. lower modulus, density, or hardness, than $sp^3$, or diamond-like carbon. $Sp^2$ content can also increase the k value, which is undesirable, as higher k values make the AHM more opaque, making it difficult to open the AHM in the right locations during a mask open operation. However, a k value less than 0.4 is sufficiently transparent for an AHM, and the films deposited at higher temperature have a similar modulus and stress, but higher hardness. Thus, in some embodiments, while there may be additional $sp^2$ content in the deposited film, the overall etch selectivity is improved by the reduction in hydrogen content.

Figure 8:
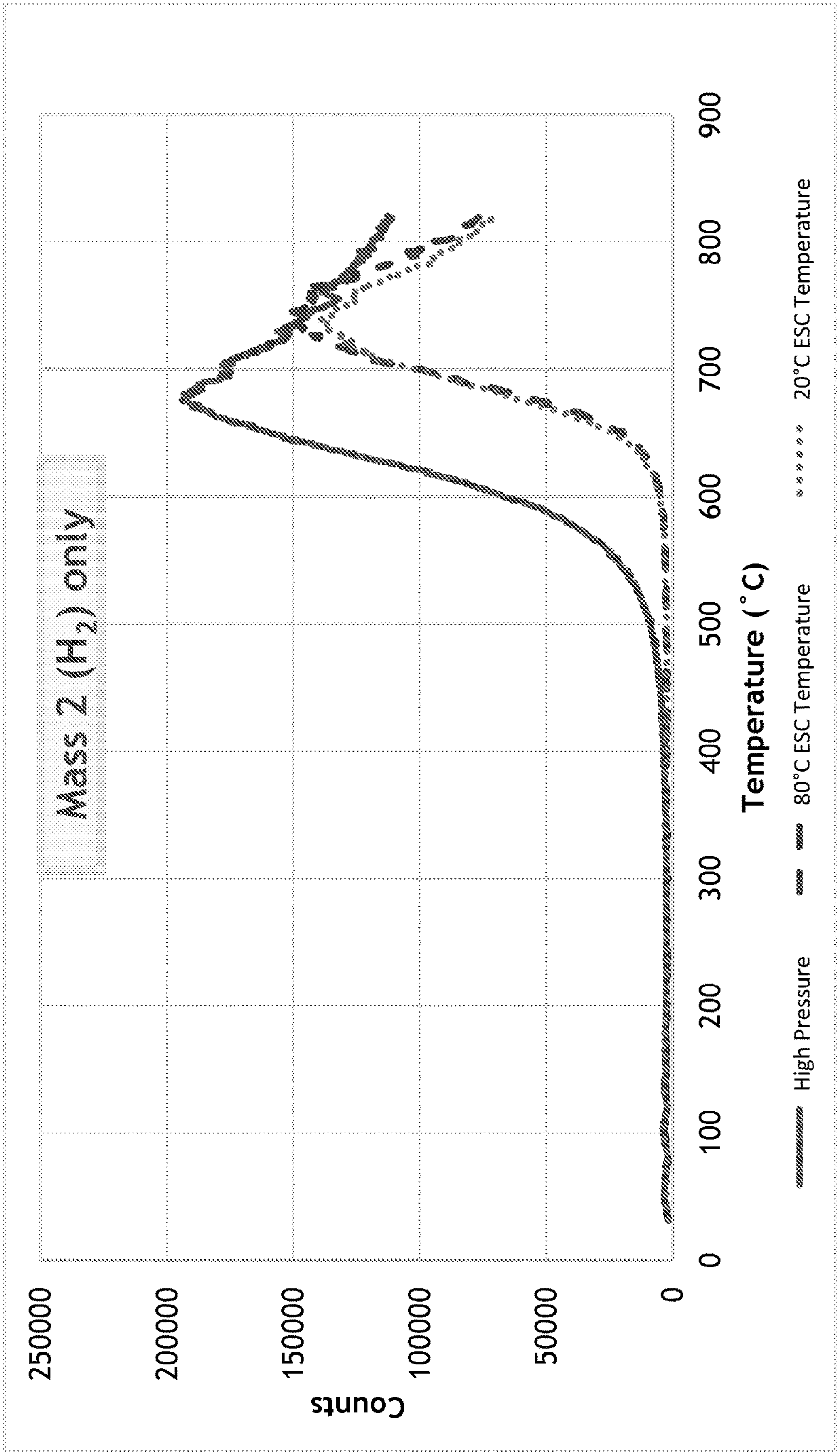
FIG. 8 shows a graph of hydrogen desorption as a function of temperature for AHM films deposited at various temperatures.

Another way to reduce the hydrogen content of an AHM is to anneal the film. FIG. 8 presents a graph showing hydrogen desorption as a function of temperature for three different films. Films must be annealed above 500 C to remove hydrogen. AHM compositional uniformity is important during the etch process, as AHM films cannot have a portion that is too easy (low density or high in hydrogen) or difficult (comprised of a different composition) to remove.

A third way to decrease hydrogen content is by adding a secondary atom to remove the hydrogen. Some examples of chemicals that will reduce hydrogen content are halogens, oxygen, nitrogen, boron and hydrogen radicals.

As noted above, a low pressure PECVD process may cause sputtering. Sputtering may generally be controlled by reducing the voltage bias, choice of carrier gas, and controlling the ion energy distribution. High density films can be deposited with dual radio frequency (RF) or single frequency (high frequency (HF) only) plasma. The LF component has a large effect on voltage bias, which accelerates the ions. Thus, bias voltage can be reduced by decreasing the LF power, and to some extent, the HF power. A lower bias voltage will cause less sputtering.

A second way to reduce sputtering is to use substantially only He as a carrier gas. Argon is conventionally used to help contain plasma for the sake of uniformity. However, heavier gasses ($N_2$, Ne, Ar, Kr) will cause greater sputtering than He at the same bias voltage.

A third way to control sputtering is to limit the distribution of carbon ion energies. While a distribution of ion energy is inherent in all plasma, HF RF, and higher frequency HF, such as 60 MHz, will have a narrow distribution of ion energy when compared with lower frequencies. Adding any LF RF will significantly broaden the ion energy distribution and generate much higher ion energies, but at lower flux of ions, increasing sputtering. Controlling the bias and distribution of ion energies will determine the amount of sputtering and thus density of the resultant film.

A specific case of sputtering is during chamber cleans. Chamber cleans may sputter the ESC. A high bias condition at low pressure will sputter alumina (AlOx) from the ESC onto the surrounding Si shroud and top electrode. This sputtered AlOx layer can then be re-sputtered onto the substrate at the start of a high bias deposition, again inhibiting the removal of the film. It is known that sputtered AlOx also increases the chances of flaking due to poor adhesion. Poor adhesion limits the amount of film which can be grown between chamber cleans, limiting throughput, so other measures must be taken to maintain adhesion to the chamber and plasma facing components.

One method is to ensure no AlOx is sputtered. This can be done in two ways: limiting the energy during cleans, and/or covering the ESC with a wafer that is then discarded. Another way to improve adhesion to the chamber and plasma facing components is to apply a precoat to the chamber. In some embodiments, $SiO_2$ is deposited using a PECVD process after every clean to improve adhesion. This process may be performed with only an HF component and flowing silicon precursors with an oxidizing substance, with a total flow between about 500 and 1000 sccm.

Another result of sputtering is the formation of an alternative composition interfacial layer. Such a layer can form between the substrate and the AHM due to high energy ion bombardment according to some embodiments herein. The higher ion energies accessible at lower pressure may cause sputtering of the Si top electrode or high energy carbon ion implantation of a Si, SiNx or SiOx substrate layer, resulting in the first 10-100 nm of a deposited AHM film containing Si. This is detrimental when etching or removing the film as the addition of Si to carbon, as SiC or SiC(N, O), will not allow for a normal ash process. This alternative composition interfacial layer can also act as an etch stop during a mask open step, where the underlying stack is exposed prior to the HAR etch.

One solution to avoid an alternative composition interfacial layer is to deposit an interfacial layer of carbon film at low bias on any silicon components that may sputter. An interfacial layer, or low bias carbon film, may be deposited either on the substrate and/or the top electrode to protect the exposed Si components in the chamber and underlying substrate from carbon ion damage and sputtering. The low bias carbon film deposition process is performed at a sufficiently low HF and LF power to not sputter the silicon components. Then, during a following process to deposit the bulk AHM film, the higher ion energies will sputter the low bias carbon film, rather than the silicon. This is advantageous to protect the silicon components as well as to prevent the formation of an undesirable alternative composition interfacial layer. In some embodiments, the low bias carbon film may be at least 5 to 50 nm thick.

In some embodiments, a crust layer may form on top of the AHM. In some embodiments, the bulk of the AHM may have a high density, e.g. a density greater than 2.1 $g/cm^3$, while a second layer, or 'crust,' at the top of the AHM has a lower density, e.g. a density less than 1.9 $g/cm^3$. In some embodiments the crust is about 4-5 nm thick. A low density film is undesirable, at it will have a much higher etch rate/lower etch selectivity, while also increasing the aspect ratio for HAR processes. The crust may be treated, prevented, or removed.

In some embodiments, the crust is treated to densify it and change its properties to be closer to the bulk film. This may accomplished by using an inert gas to bombard the surface at a high bias, such as a bias above 100V. Similar to a high ion energy PECVD process as described herein, a high energy, non-depositing species may densify the crust.

In other embodiments, the crust may be prevented by altering the process conditions. In some embodiments, the RF power is stepped down as the process concludes. If there is any precursor remaining in the chamber, the precursor may deposit with a lower ion energy, resulting in a crust. The deposition of a crust may be avoided by diverting or otherwise evacuating the process chamber of precursor before the high bias RF conditions are turned off. After the precursor has been diverted or evacuated from the chamber, the RF power may be stepped down without depositing a crust layer. Maintaining the plasma after deposition also ensures that carbon particles formed during the deposition are removed away via gas flow after the deposition concludes.

In some embodiments, the crust is removed by treating the AHM with a partial ashing process to remove the crust. In some embodiments the partial ashing process may remove only the crust layer. In some embodiments, the partial ashing process removes up to about 10 nm of the AHM. This may be performed at a lower HF power and lower, or zero, LF power, than the process for depositing the bulk AHM in order to avoid ashing the desirable, bulk AHM film. In some embodiments, this may be performed with an HF power between about 200 and 1000 W, at a pressure greater than 50 mTorr, with a flow between about 200 and 1000 sccm of ashing gas (e.g. $O_2$ or $N_2O$).

Process Window

This section describes various process parameters that may be employed to produce AHM films. The process parameters are provided for a plasma enhanced chemical vapor deposition process that takes place in a process chamber such as one described below.

In various embodiments, the total pressure in the process chamber is between about 3 mTorr and about 500 mTorr. In some embodiments, pressure is between about 3 mTorr and about 150 mTorr, or between about 3 mTorr and about 30 mTorr. Pressure below about 30 mTorr may allow for a collision-free plasma. Collision-free plasma is characterized by the ion energy being unaffected by collisions between particles. This may be advantageous, as noted in reference to FIG. 7, to control the distribution of ion energies. At higher pressure the ions experience collisions, causing a more even distribution of ion energies than at lower pressure.

In some embodiments, the hydrocarbon precursor is one defined by the formula $C_xH_y$, wherein X is an integer between 2 and 10, and Y is an integer between 2 and 24. Examples include methane ($CH_4$), acetylene ($C_2H_2$), ethylene ($C_2H_4$), propylene ($C_3H_6$), butane ($C_4H_{10}$), cyclohexane ($C_6H_{12}$), benzene ($C_6H_6$), and toluene ($C_7H_8$). In certain embodiments the hydrocarbon precursor is a halogenated hydrocarbon, where one or more hydrogen atoms are replaced by a halogen, particularly fluorine, chlorine, bromine, and/or iodine. In some embodiments the hydrocarbon precursor comprises compounds having a molecular weight of at most about 50 g/mol. In some embodiments the hydrocarbon precursor has a ratio of C:H of at least 1:2. In some embodiments the hydrocarbon precursor is acetylene ($C_2H_2$). In some embodiments, two or more hydrocarbon precursors may be used.

In some embodiments the inert gas comprises at least about 10% or at least about 80% or at least about 95% helium by volume of all inert gas used. In some embodiments the inert gas is helium substantially without any other inert gas, where substantially means there may be trace amounts of other inert gases. In some embodiments, the inert gas is not deposited or incorporated into the deposited AHM film.

Precursor gas volumetric flow rates depend on the particular process chamber, substrate, and other process conditions. Examples of volumetric flow rates that may be used for a single 300 mm substrate are between about 100 sccm and about 500 sccm, between about 500 sccm and 1000 sccm, or between about 100 sccm and about 2000 sccm, of total volumetric flow of hydrocarbon precursor and inert gas. A ratio between the hydrocarbon precursor and the inert gas may be between about 0.01 and about 0.8, for example about 50 sccm of acetylene and about 100 sccm He. In some embodiments the flow rate of hydrocarbon precursor is between about 1% and about 45% of the total flow rate and inert gas comprises the rest of the total flow rate. In some embodiments the volumetric flow is between about 1 sccm and about 45 sccm $C_2H_2$, and between about 99 sccm and about 55 sccm helium. In some embodiments the volumetric flow is between about 5 sccm and about 225 sccm $C_2H_2$, and between about 495 sccm and about 275 sccm helium, all values per 300 mm substrate. Unless otherwise specified, the flow rates disclosed herein are for a single station tool configured for 300 mm wafers. Flow rates generally scale linearly with the number of stations and substrate area.

The AHM film deposition methods described herein may be performed at any appropriate process temperature to obtain desired AHM characteristics, with example temperature of the ESC ranging from about −20° C. to about 175° C. In some embodiments the process temperature is between about −20° C. and about 80° C. In some embodiments the process temperature is between about 80° C. and about 125° C. Depositing an AHM at higher temperatures, e.g. between 80° C. and 175° C., or between 80° C. and 125° C., may improve the etch selectivity of the AHM. Specifically, AHM films deposited at an ESC temperature of 80° C. may have a lower etch rate, e.g. about 20% lower, than an AHM deposited at 20° C. when using a process for etching silicon oxide. Process temperature can affect the stress, selectivity, and transparency at least in part due to $sp^2$ bond versus $sp^3$ bond formation. Higher temperatures favor $sp^2$ rich amorphous carbon network formation as the high temperatures enable easy breakage of C—H bonds and subsequent diffusion of hydrogen. For example, films deposited at temperatures above about 200° C. may have significantly more $sp^2$ CH and $CH_2$ bonds and relatively fewer $sp^3$ bonds, which have increased carbon content and higher density, and correlate with increased etch selectivity. AHM films deposited at lower temperatures, e.g., below about 175° C. may have less $sp^2$ bonding compared to films deposited at higher temperatures.

As described above, annealing may be performed at temperatures of about 500° C. or more. Annealing may be performed to reduce the hydrogen content of the film.

In some embodiments, low frequency (LF) RF power refers to an RF power having a frequency between about 100 kHz and about 2.4 MHz. In some embodiments, LF RF power has a frequency of about 400 kHz. High frequency RF power refers to an RF power having a frequency between about 2 MHz and about 100 MHz. In some embodiments, HF RF power has a frequency of about 60 MHz, a frequency of about 27 MHz, or a frequency of about 13.56 MHz.

In some embodiments, instead of, or in addition to, an LF component, a pulsed direct current (DC) bias, also known as a tailored waveform DC, can be applied to the electrostatic chuck to accelerate ions. The potential may be between about 100V to 10000V with a duty cycle between about 10 to 90% and a repetition rate between about 100 Hz to 10 kHz.

In some embodiments, the HF power may be between about 50 W and about 2500 W. In some embodiments, the HF power may be between about 50 W and about 1000 W. In some embodiments, the HF power may be between 50 W and 150 W. Generally, higher HF power causes a higher deposition rate. HF power also has a slight correlation with the voltage bias of the pedestal. A lower HF power may be used if there is an LF component, but if the LF power is low or zero, the HF power may be higher to provide a minimum ion energy to get over the spikes and densify the film, as discussed above.

In some embodiments, if a higher HF power is used, for example an HF of about 700 W or more, a higher LF power may be used. As described in reference to FIGS. 4 and 6, LF power correlates to the pedestal bias. At higher HF power, a higher LF power may have a less substantial effect on modulus, allowing for higher LF powers to be used to, for example, reduce hydrogen content.

In some embodiments, the LF power may vary between 0 W and 4000 W. In some embodiments, the LF power may vary between 0 W and 10000 W. In some embodiments where the HF power is between 50 W and 150 W, the LF power may be between 50 W and 500 W, 50 W and 250 W, or 250 W and 500 W. LF power has a large correlation with the pedestal bias, and therefore may have a large effect on the peak ion energy. Higher LF power may also reduce the hydrogen content of the film. At an HF power between 50 W and 150 W and a LF power between 50 W and 250 W, an AHM film may have higher modulus than other HF powers or LF powers.

In many embodiments, the minimum power of the HF RF component and the minimum power of the LF RF component are sufficient to maintain a plasma. All powers provided herein are per 300 mm substrate. RF power as described herein generally scales linearly with number of stations and area of wafers. The power values may be represented on a per area basis, e.g., 2500 W may also be represented as 0.884 W/cm$^2$ for a 300 mm wafer.

In some processes herein the AHM film deposits at a rate of at least about 350 Å/min. In some embodiments the AHM film deposits at a rate of between about 350 Å/min and about 5000 Å/min. The deposition rate of the AHM film may depend on the LF and HF power, chamber pressure, process temperature, and hydrocarbon precursor.

In some embodiments the gap between the pedestal and the showerhead is less than about 0.75 inches (20 mm) or between about 0.25 inches (about 6 mm) and about 0.75 inches (about 20 mm). As the RF power of the plasma increases, the gap between the pedestal and the showerhead may be increased without reducing the quality of the deposited AHM.

Film Properties

AHM films produced in accordance with the disclosed methods are typically composed primarily of carbon and hydrogen, but other elements may be present in the film. Generally, the lower the atomic percent of hydrogen in the mask, the higher the modulus and selectivity. In some embodiments other elements may be added to the gas mixture, for example, if a halogenated hydrocarbon is used, the halogen may comprise a percentage of the film composition. In some embodiments, the hydrogen concentration is at most about 30 percent atomic. In some embodiments, the hydrogen concentration is between about 23 and 30 percent atomic. In some embodiments the carbon concentration is at least about 70 percent atomic. In some embodiments the carbon concentration is between about 70 and 77 percent atomic. In some embodiments, the sp$^3$ content of the AHM is between about 40% and 75%, or about 67%. Examples of other elements that may be present in the AHM film include halogens, Nitrogen, sulfur, boron, oxygen, tungsten, titanium, and aluminum. Typically, such other elements are present in amounts not greater than about 10 percent atomic.

In some embodiments, an AHM film produced in accordance with the methods describe herein has an internal stress magnitude of at most about −3000 MPa, or between about −150 MPa and about −3000 MPa. (negative internal stress denotes a compressive stress, such that lower values have less internal stress) In some embodiments, the AHM film has an elastic modulus of at least about 120 GPa, or between about 120 GPa and 190 GPa. In some embodiments, the AHM film has an elastic modulus of at least 180 GPa. In some embodiments, the AHM film has a hardness of at least about 12 GPa, or between about 12 GPa and about 24 GPa. In some embodiments, the AHM film has a density of at least about 1.8 g/cm$^3$, or between about 1.8 g/cm$^3$ and about 2.3 gm/cm$^3$.

In some embodiments an AHM film produced in accordance with the methods described herein has an extinction coefficient at 633 nm of at most about 0.35, or between about 0.15 and 0.35. The extinction coefficient may correlate with the ability of light to move through the AHM film, or the transparency of the film. In some embodiments, AHM films are transparent or translucent. AHM films without sufficiently low values of extinction coefficient may require additional operations in a later etch process to etch the AHM film, which is undesirable.

In some embodiments an AHM film produced in accordance with the methods described herein has a refractive index of at least 2.15, or between about 2.15 and 2.50. Refractive index, or RI, can generally be used as a proxy for the selectivity of the material, with higher refractive index indicating higher selectivity of an AHM.

In some embodiments the thickness of an AHM film deposited in accordance with methods disclosed herein is at least 100 nm, or between about 100 nm and about 3500 nm. Generally, the desired thickness of an AHM film may vary depending on the thickness of the underlying layers to be etched and the etch selectivity of the AHM, with thicker underlying layers to be etched requiring a thicker AHM. As discussed above, AHM films are used to etch a variety of underlying materials, and may have a different etch selectivity for each material. Etch selectivity of an AHM can be represented as a ratio of the etch rate of a material and the etch rate of the AHM, and may vary for different materials and etch chemistries.

Applications

AHMs are typically used for creating features of semiconductor devices by etching one or more underlying layers of a substrate. Materials that may be etched using an AHM may include silicon (single crystal, polysilicon, or amorphous silicon), silicon oxide, silicon nitride, and tungsten. In some embodiments multiple layers are stacked and etched using a single AHM. Examples of such stacks include a layer of silicon and a layer of silicon oxide, and a layer of tungsten and a layer of silicon nitride. In some embodiments a stack includes repeating layers that are etched using a single AHM. Examples of such repeating layers include repeating layers of silicon oxide/polysilicon (OPOP). Front end of line and back end of line features may be etched using an AHM as disclosed herein. Memory or logic device features may be patterned. Examples of memory devices include: DRAM, NAND, and 3D NAND.

Apparatus

Figure 9A:
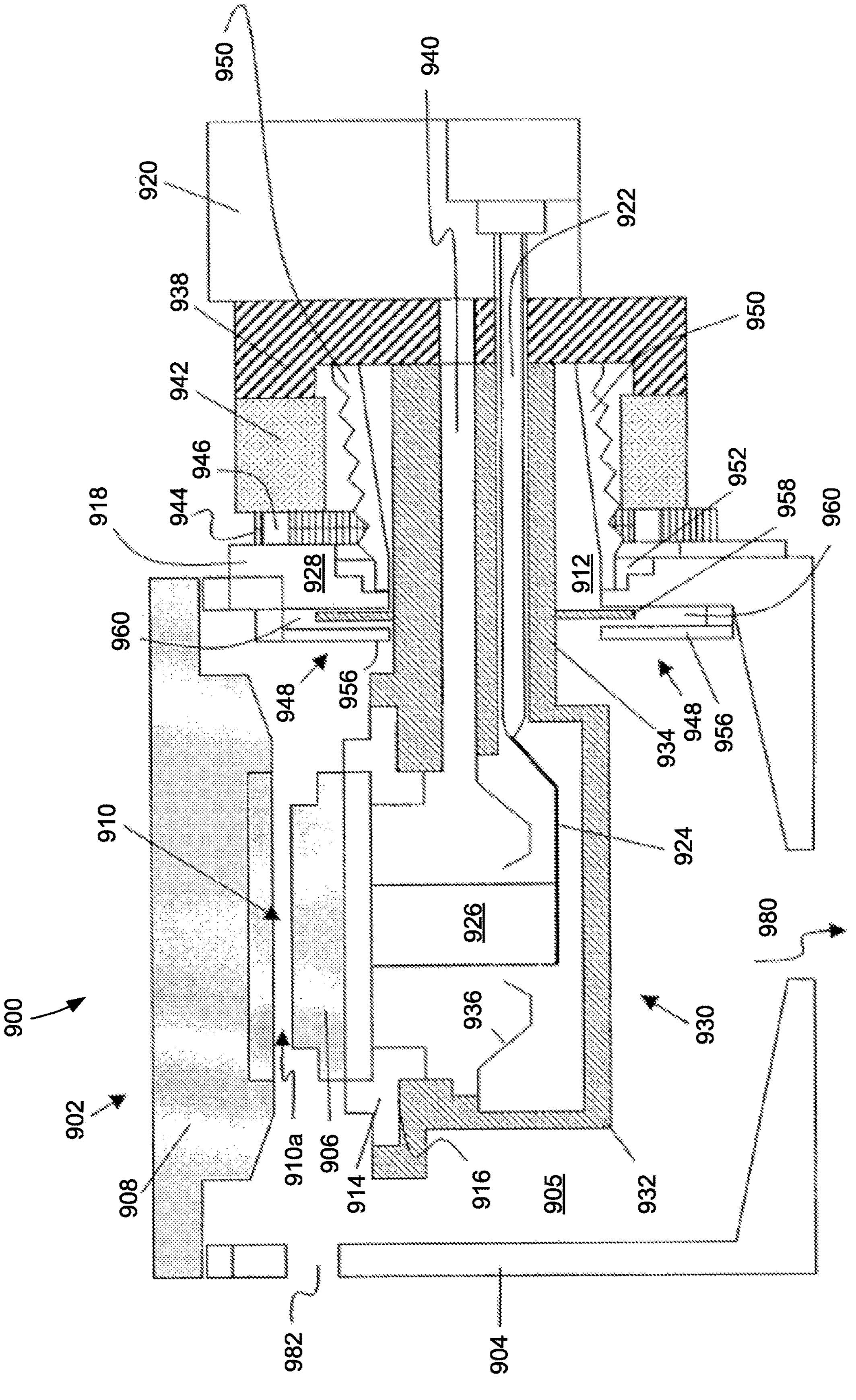
FIG. 9A-C shows a schematic illustrations of a plasma enhanced chemical vapor deposition (PECVD) chamber suitable for practicing various embodiments.
Figure 9B:
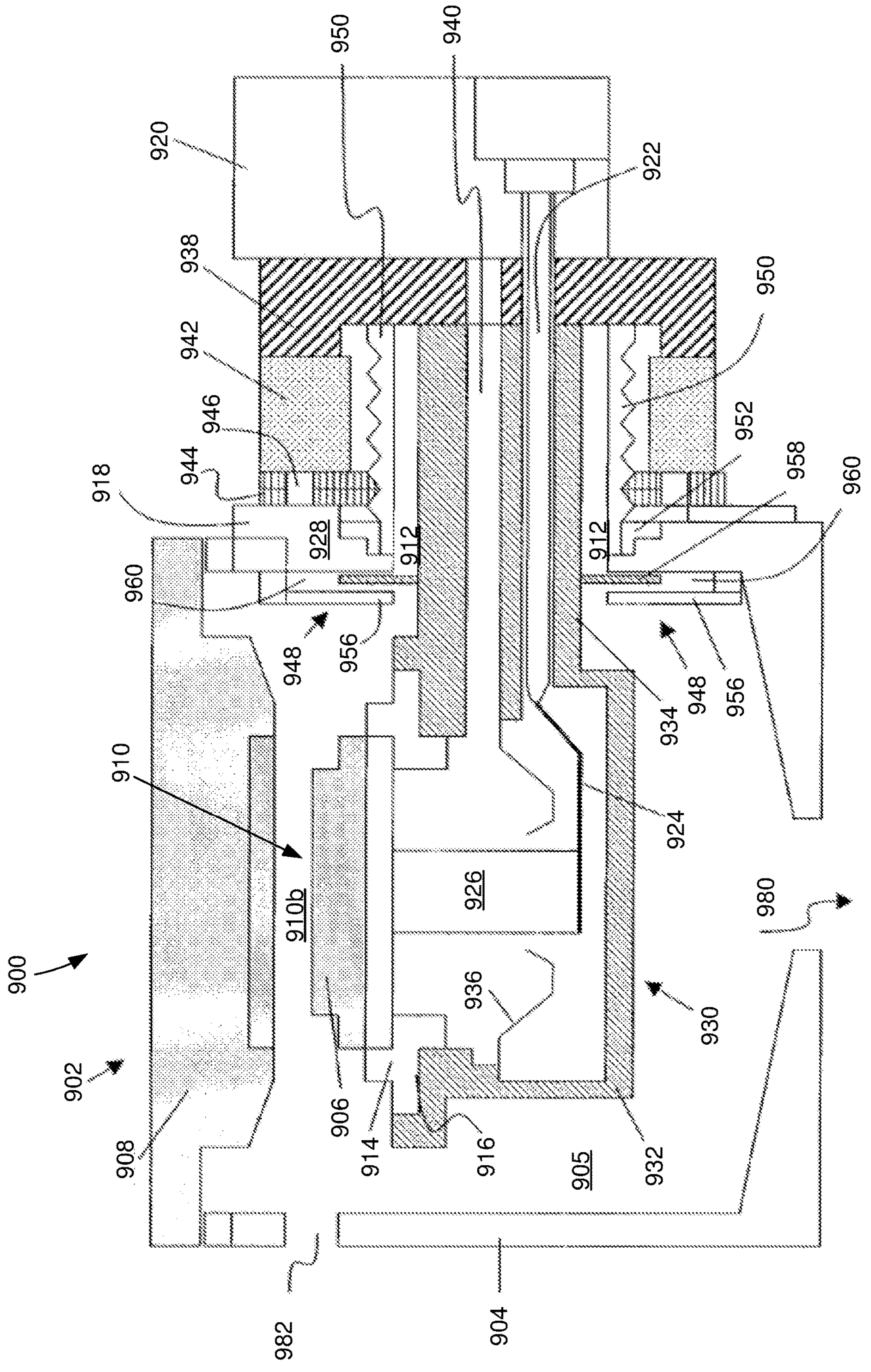
Figure 9C:
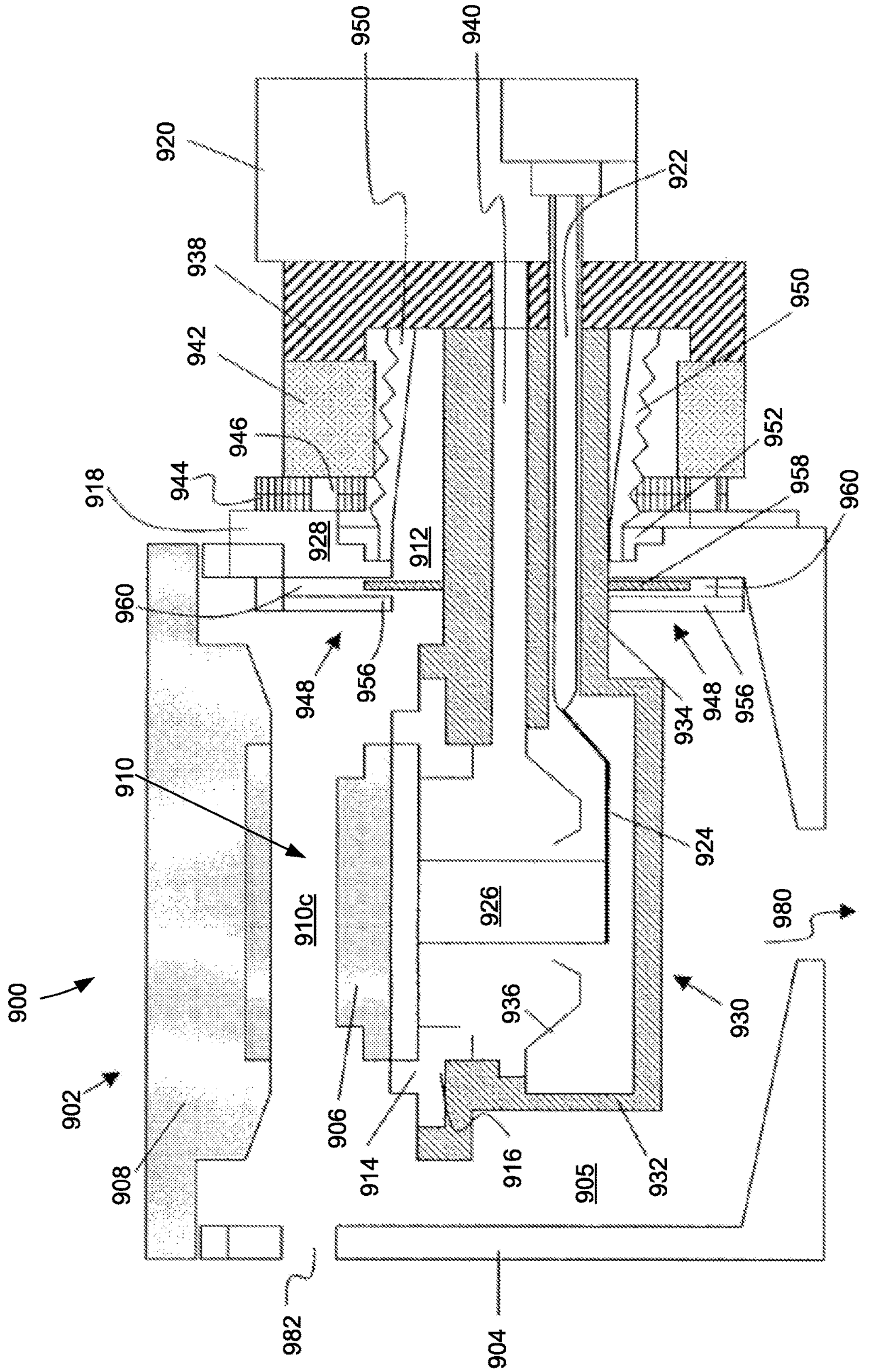

FIGS. 9A-9C illustrate an embodiment of an adjustable gap capacitively coupled confined RF plasma reactor 900 that may be used for performing the etching operations described herein. As depicted, a vacuum chamber 902 includes a chamber housing 904, surrounding an interior space housing a lower electrode 906. In an upper portion of the chamber 902 an upper electrode 908 is vertically spaced apart from the lower electrode 906. Planar surfaces of the upper and lower electrodes 908, 906 are substantially parallel and orthoganol to the vertical direction between the electrodes. Preferably the upper and lower electrodes 908, 906 are circular and coaxial with respect to a vertical axis. A lower surface of the upper electrode 908 faces an upper surface of the lower electrode 906. The spaced apart facing electrode surfaces define an adjustable gap 910 therebetween. During operation, the lower electrode 906 is supplied RF power by an RF power supply (match) 920. RF power is supplied to the lower electrode 906 though an RF supply conduit 922, an RF strap 924 and an RF power member 926. A grounding shield 936 may surround the RF power member 926 to provide a more uniform RF field to the lower electrode 906. As described in commonly-owned U.S. Pat. No. 7,732,728, the entire contents of which are herein incorporated by reference, a wafer is inserted through wafer port 982 and supported in the gap 910 on the lower electrode 906 for processing, a process gas is supplied to the gap 910 and excited into plasma state by the RF power. The upper electrode 908 can be powered or grounded.

In the embodiment shown in FIGS. 9A-9C, the lower electrode 906 is supported on a lower electrode support plate 916. An insulator ring 914 interposed between the lower electrode 906 and the lower electrode support plate 916 insulates the lower electrode 906 from the support plate 916.

An RF bias housing 930 supports the lower electrode 906 on an RF bias housing bowl 932. The bowl 932 is connected through an opening in a chamber wall plate 918 to a conduit support plate 938 by an arm 934 of the RF bias housing 930. In a preferred embodiment, the RF bias housing bowl 932 and RF bias housing arm 934 are integrally formed as one component, however, the arm 934 and bowl 932 can also be two separate components bolted or joined together.

The RF bias housing arm 934 includes one or more hollow passages for passing RF power and facilities, such as gas coolant, liquid coolant, RF energy, cables for lift pin control, electrical monitoring and actuating signals from outside the vacuum chamber 902 to inside the vacuum chamber 902 at a space on the backside of the lower electrode 906. The RF supply conduit 922 is insulated from the RF bias housing arm 934, the RF bias housing arm 934 providing a return path for RF power to the RF power supply 920. A facilities conduit 940 provides a passageway for facility components. Further details of the facility components are described in U.S. Pat. Nos. 5,948,704 and 7,732,728 and are not shown here for simplicity of description. The gap 910 is preferably surrounded by a confinement ring assembly or shroud (not shown), details of which can be found in commonly owned published U.S. Pat. No. 7,740,736 herein incorporated by reference. The interior of the vacuum chamber 902 is maintained at a low pressure by connection to a vacuum pump through vacuum portal 980.

The conduit support plate 938 is attached to an actuation mechanism 942. Details of an actuation mechanism are described in commonly-owned U.S. Pat. No. 7,732,728 incorporated herein by above. The actuation mechanism 942, such as a servo mechanical motor, stepper motor or the like is attached to a vertical linear bearing 944, for example, by a screw gear 946 such as a ball screw and motor for rotating the ball screw. During operation to adjust the size of the gap 910, the actuation mechanism 942 travels along the vertical linear bearing 944. FIG. 9A illustrates the arrangement when the actuation mechanism 942 is at a high position on the linear bearing 944 resulting in a small gap 910*a*. FIG. 9B illustrates the arrangement when the actuation mechanism 942 is at a mid position on the linear bearing 944. As shown, the lower electrode 906, the RF bias housing 930, the conduit support plate 938, the RF power supply 920 have all moved lower with respect to the chamber housing 904 and the upper electrode 908, resulting in a medium size gap 910*b*.

FIG. 9C illustrates a large gap 910*c* when the actuation mechanism 942 is at a low position on the linear bearing. Preferably, the upper and lower electrodes 908, 906 remain co-axial during the gap adjustment and the facing surfaces of the upper and lower electrodes across the gap remain parallel.

This embodiment allows the gap 910 between the lower and upper electrodes 906, 908 in the CCP chamber 902 during multi-step process recipes (BARC, HARC, and STRIP etc.) to be adjusted, for example, in order to maintain uniform etch across a large diameter substrate such as 300 mm wafers or flat panel displays. In particular, this chamber pertains to a mechanical arrangement that permits the linear motion necessary to provide the adjustable gap between lower and upper electrodes 906, 908.

FIG. 9A illustrates laterally deflected bellows 950 sealed at a proximate end to the conduit support plate 938 and at a distal end to a stepped flange 928 of chamber wall plate 918. The inner diameter of the stepped flange defines an opening 912 in the chamber wall plate 918 through which the RF bias housing arm 934 passes. The distal end of the bellows 950 is clamped by a clamp ring 952.

The laterally deflected bellows 950 provides a vacuum seal while allowing vertical movement of the RF bias housing 930, conduit support plate 938 and actuation mechanism 942. The RF bias housing 930, conduit support plate 938 and actuation mechanism 942 can be referred to as a cantilever assembly. Preferably, the RF power supply 920 moves with the cantilever assembly and can be attached to the conduit support plate 938. FIG. 9B shows the bellows 950 in a neutral position when the cantilever assembly is at a mid position. FIG. 9C shows the bellows 950 laterally deflected when the cantilever assembly is at a low position.

A labyrinth seal 948 provides a particle barrier between the bellows 950 and the interior of the plasma processing chamber housing 904. A fixed shield 956 is immovably attached to the inside inner wall of the chamber housing 904 at the chamber wall plate 918 so as to provide a labyrinth groove 960 (slot) in which a movable shield plate 958 moves vertically to accommodate vertical movement of the cantilever assembly. The outer portion of the movable shield plate 958 remains in the slot at all vertical positions of the lower electrode 906.

In the embodiment shown, the labyrinth seal 948 includes a fixed shield 956 attached to an inner surface of the chamber wall plate 918 at a periphery of the opening 912 in the chamber wall plate 918 defining a labyrinth groove 960. The movable shield plate 958 is attached and extends radially from the RF bias housing arm 934 where the arm 934 passes through the opening 912 in the chamber wall plate 918. The movable shield plate 958 extends into the labyrinth groove 960 while spaced apart from the fixed shield 956 by a first gap and spaced apart from the interior surface of the chamber wall plate 918 by a second gap allowing the cantilevered assembly to move vertically. The labyrinth seal 948 blocks migration of particles spalled from the bellows 950 from entering the vacuum chamber interior 905 and blocks radicals from process gas plasma from migrating to the bellows 950 where the radicals can form deposits which are subsequently spalled.

FIG. 9A shows the movable shield plate 958 at a higher position in the labyrinth groove 960 above the RF bias housing arm 934 when the cantilevered assembly is in a high position (small gap 910*a*). FIG. 9C shows the movable shield plate 958 at a lower position in the labyrinth groove 960 above the RF bias housing arm 934 when the cantilevered assembly is in a low position (large gap 910*c*). FIG. 9B shows the movable shield plate 958 in a neutral or mid position within the labyrinth groove 960 when the cantilevered assembly is in a mid position (medium gap 910*b*). While the labyrinth seal 948 is shown as symmetrical about the RF bias housing arm 934, in other embodiments the labyrinth seal 948 may be asymmetrical about the RF bias arm 934.

Figure 10:
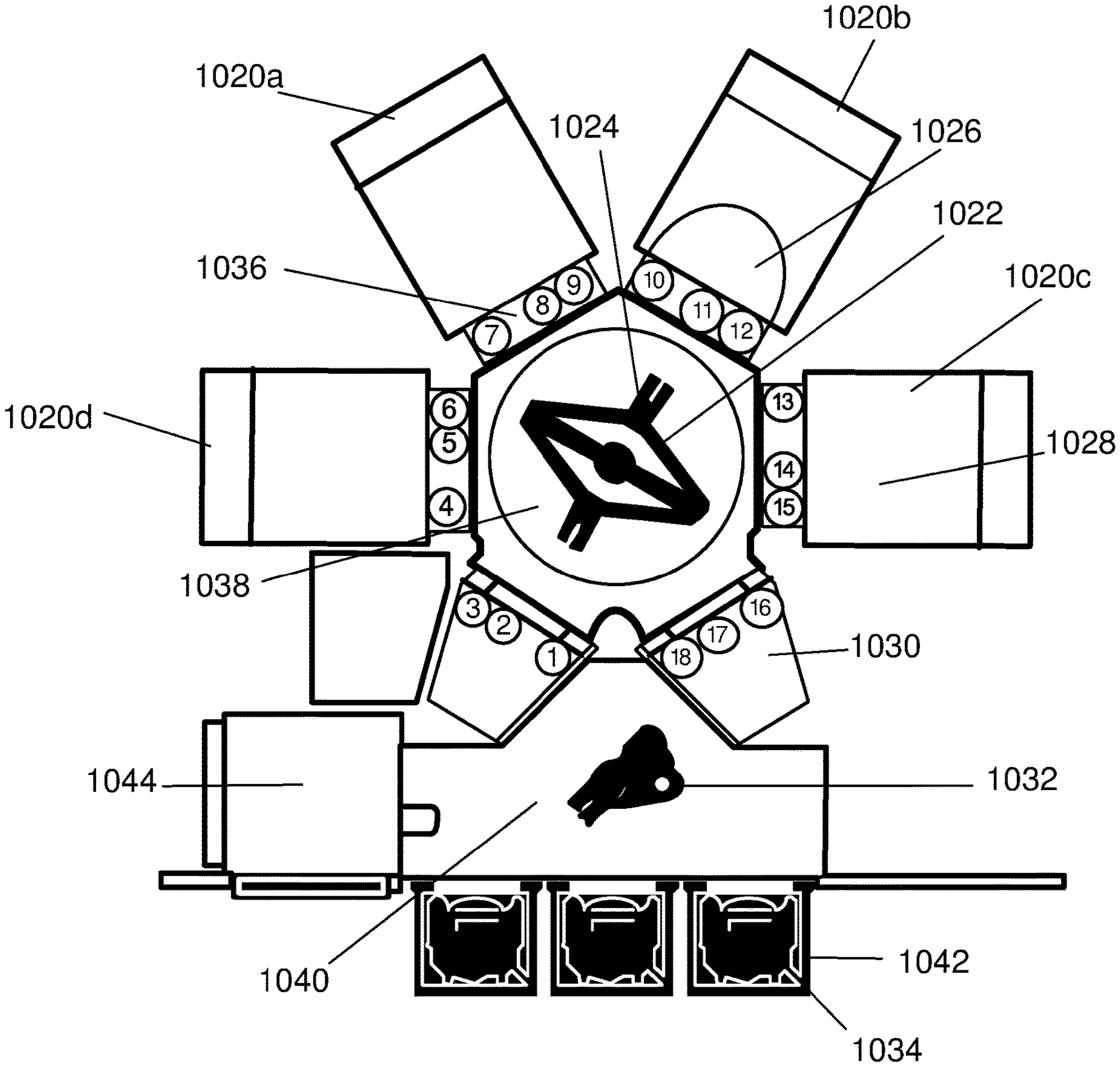
FIG. 10 shows a schematic illustration of a module cluster suitable for practicing various embodiments.

FIG. 10 depicts a semiconductor process cluster architecture with various modules that interface with a vacuum transfer module 1038 (VTM). The arrangement of transfer modules to "transfer" substrates among multiple storage facilities and processing modules may be referred to as a "cluster tool architecture" system. Airlock 1030, also known as a loadlock or transfer module, is shown in VTM 1038 with four processing modules 1020*a*-1020*d*, which may be individually optimized to perform various fabrication processes. By way of example, processing modules 1020*a*-1020*d* may be implemented to perform substrate etching, deposition, ion implantation, substrate cleaning, sputtering, and/or other semiconductor processes as well as laser metrology and other defect detection and defect identification methods. One or more of the processing modules (any of 1020*a*-1020*d*) may be implemented as disclosed herein, i.e., for etching recessed features into substrates. Airlock 1030 and process modules 1020*a*-1020*d* may be referred to as "stations." Each station has a facet 1036 that interfaces the station to VTM 1038. Inside the facets, sensors 1-18 are used to detect the passing of substrate 1026 when moved between respective stations.

Robot 1022 transfers substrates between stations. In one implementation, the robot may have one arm, and in another implementation, the robot may have two arms, where each arm has an end effector 1024 to pick substrates for transport. Front-end robot 1032, in atmospheric transfer module (ATM) 1040, may be used to transfer substrates from cassette or Front Opening Unified Pod (FOUP) 1034 in Load Port Module (LPM) 1042 to airlock 1030. Module center 1028 inside process modules 1020*a*-1020*d* may be one location for placing the substrate. Aligner 1044 in ATM 1040 may be used to align substrates.

In an exemplary processing method, a substrate is placed in one of the FOUPs 1034 in the LPM 1042. Front-end robot 1032 transfers the substrate from the FOUP 1034 to the aligner 1044, which allows the substrate 1026 to be properly centered before it is etched, or deposited upon, or otherwise processed. After being aligned, the substrate is moved by the front-end robot 1032 into an airlock 1030. Because airlock modules have the ability to match the environment between an ATM and a VTM, the substrate is able to move between the two pressure environments without being damaged. From the airlock module 1030, the substrate is moved by robot 1022 through VTM 1038 and into one of the process modules 1020*a*-1020*d*, for example process module 1020*a*. In order to achieve this substrate movement, the robot 1022 uses end effectors 1024 on each of its arms. In process module 1020*a*, the substrate undergoes etching as described. Next, the robot 1022 moves the substrate out of processing module 1020*a* to its next desired position.

It should be noted that the computer controlling the substrate movement can be local to the cluster architecture, or can be located external to the cluster architecture in the manufacturing floor, or in a remote location and connected to the cluster architecture via a network.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

CONCLUSION

Although the foregoing embodiments have been described in some detail for purposes of clarity of understanding, it will be apparent that certain changes and modifications may be practiced within the scope of the appended claims. Embodiments disclosed herein may be practiced without some or all of these specific details. In other instances, well-known process operations have not been described in detail to not unnecessarily obscure the disclosed embodiments. Further, while the disclosed embodiments will be described in conjunction with specific embodiments, it will be understood that the specific embodiments are not intended to limit the disclosed embodiments. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:

exposing a semiconductor substrate in a chamber to a process gas comprising a hydrocarbon precursor gas and helium gas, substantially without any other inert gas;

depositing on the substrate an interfacial layer by a first plasma enhanced chemical vapor deposition (PECVD) process, wherein depositing the interfacial layer comprises igniting a plasma generated by a dual radio frequency (RF) plasma source including a high frequency (HF) component and a low frequency (LF) component, wherein the interfacial layer is a carbon-containing layer; and depositing on the interfacial layer an ashable hard mask (AHM) film by a second PECVD process, wherein the second PECVD process comprises:

maintaining the chamber pressure between about 3 and 30 mTorr;

igniting a plasma generated by the dual RF plasma source including a high frequency (HF) component and a low frequency (LF) component, wherein the HF component and the LF component of the second PECVD process are at a higher power than during deposition of the interfacial layer.

2. The method of claim 1, wherein the HF power during the second PECVD process is at least about 50 W.

3. The method of claim 1, wherein the HF power during the second PECVD process is between about 50 W and 2500 W.

4. The method of claim 1, wherein the HF power has a frequency between about 2 MHz and about 100 MHz.

5. The method of claim 1, wherein the LF power has a frequency between about 100 kHz and about 2.4 MHz.

6. The method of claim 1, wherein the LF power during the second PECVD process is 0 W.

7. The method of claim 1, wherein the LF power during the second PECVD process is between 50 and 500 W.

8. The method of claim 1, wherein the LF power during the second PECVD process is between 250 and 500 W.

9. The method of claim 1, wherein the HF power during the second PECVD process is between about 50 and 150 W, and the LF power during the second PECVD process is between about 50 and 500 W.

10. The method of claim 1, wherein a direct current bias is applied to an electrostatic chuck that the semiconductor substrate rests upon during the second PECVD process, and the potential of the DC bias may be between 100V to 10000V.

11. The method of claim 10, wherein the direct current bias has a duty cycle between about 10% and about 90%, and a repetition rate between about 100 Hz and 10 kHz.

12. The method of claim 1, wherein a deposition rate during the second PECVD process of the AHM is at least 350 Å/min.

13. The method of claim 1, wherein the chamber includes an electrostatic chuck that the semiconductor substrate rests upon during the first and second PECVD processes, and the electrostatic chuck temperature is between −20° C. and 175° C.

14. The method of claim 1, further comprising annealing the AHM at a temperature of at least 500° C.

15. The method of claim 1, wherein the hydrocarbon precursor gas comprises compounds having a molecular weight of at most about 50 g/mol.

16. The method of claim 1, wherein the hydrocarbon precursor gas comprises compounds having a C:H ratio of at least 0.5.

17. The method of claim 1, wherein the hydrocarbon precursor gas comprises acetylene ($C_2H_2$).

18. The method of claim 1, wherein the modulus of the AHM film is at least about 120 GPa.

19. The method of claim 1, wherein the hardness of the AHM film is at least about 12 GPa.

20. The method of claim 1, wherein the $sp^3$ content of the AHM film is at least about 67%.

21. The method of claim 1, wherein the density of the AHM film is at least about 1.8 $g/cm^3$.

22. The method of claim 1, wherein the thickness of the AHM film is at least about 0.1 μm.

23. The method of claim 1, further comprising treating the AHM film to ash no more than 10 nm of the AHM to remove a crust layer.

24. The method of claim 1, further comprising treating the AHM film to densify a crust layer by bombarding the AHM with a process gas that does not include a hydrocarbon precursor.

25. The method of claim 1, further comprising:

removing hydrocarbon precursor from the process chamber; and after removing hydrocarbon precursor from the process chamber, lowering the power of the HF component and/or the LF component.

26. The method of claim 1, further comprising cleaning the chamber using a discard-able wafer as a cover for an electrostatic chuck.

27. The method of claim 1, further comprising depositing a layer of $SiO_2$ on any plasma facing components within the process chamber.

* * * * *